United States Patent
Hill et al.

(10) Patent No.: US 11,367,598 B2
(45) Date of Patent: Jun. 21, 2022

(54) METHOD AND APPARATUS FOR DEPOSITION CLEANING IN A PUMPING LINE

(71) Applicant: MKS INSTRUMENTS, INC., Andover, MA (US)

(72) Inventors: Gordon Hill, Arlington, MA (US); Scott Benedict, Nashua, NH (US); Kevin Wenzel, Belmont, MA (US)

(73) Assignee: MKS Instruments, Inc., Andover, MA (US)

(*) Notice: Subject to any disclaimer, the term of this patent is extended or adjusted under 35 U.S.C. 154(b) by 0 days.

(21) Appl. No.: 17/107,146

(22) Filed: Nov. 30, 2020

(65) Prior Publication Data

US 2021/0082672 A1   Mar. 18, 2021

Related U.S. Application Data

(60) Continuation of application No. 16/679,640, filed on Nov. 11, 2019, now Pat. No. 11,024,489, which is a
(Continued)

(51) Int. Cl.
*H01J 37/32* (2006.01)
*F16K 1/22* (2006.01)
(Continued)

(52) U.S. Cl.
CPC .......... *H01J 37/32862* (2013.01); *F16K 1/22* (2013.01); *F16K 3/06* (2013.01);
(Continued)

(58) Field of Classification Search
None
See application file for complete search history.

(56) References Cited

U.S. PATENT DOCUMENTS

| 5,637,279 A | 6/1997 | Besen et al. |
| 5,707,451 A | 1/1998 | Robles et al. |

(Continued)

FOREIGN PATENT DOCUMENTS

| EP | 2312612 | 4/2011 |
| EP | 2312612 B2 | 4/2011 |

(Continued)

OTHER PUBLICATIONS

Hur Min et al.•"AC Low-pressure Plasmas Generated by Using Annular-shaped Electrodes for Abatement of Pollutants Emitted during Semiconductor Manufacturing Processes'". Journal of the Korean Physical Society, vol. 59, No. 4, Oct. 14, 2011, pp. 2742-2749.

(Continued)

*Primary Examiner* — Eric W Golightly
(74) *Attorney, Agent, or Firm* — Proskauer Rose LLP

(57) ABSTRACT

A vacuum pumping line plasma source is provided. The plasma source includes a body defining a generally cylindrical interior volume extending along a central longitudinal axis. The body has an input port for coupling to an input pumping line, an output port for coupling to an output pumping line, and an interior surface disposed about the generally cylindrical interior volume. The plasma source also includes a supply electrode disposed adjacent to a return electrode, and a barrier dielectric member, a least a portion of which is positioned between the supply electrode and the return electrode. The plasma source further includes a dielectric barrier discharge structure formed from the supply electrode, the return electrode, and the barrier dielectric member. The dielectric barrier discharge structure is adapted to generate a plasma in the generally cylindrical interior volume.

21 Claims, 20 Drawing Sheets

Related U.S. Application Data division of application No. 15/404,457, filed on Jan. 12, 2017, now Pat. No. 10,535,506, which is a continuation-in-part of application No. 14/994,668, filed on Jan. 13, 2016, now Pat. No. 10,337,105.

(51) Int. Cl.
*F16K 3/06* (2006.01)
*F16K 15/02* (2006.01)
*F16K 51/02* (2006.01)

(52) U.S. Cl.
CPC ............ *F16K 15/026* (2013.01); *F16K 51/02* (2013.01); *H01J 37/32348* (2013.01); *H01J 37/32568* (2013.01); *H01J 37/32844* (2013.01); *H01J 37/32963* (2013.01); *Y02C 20/30* (2013.01)

(56) References Cited

U.S. PATENT DOCUMENTS

| | | |
|---|---|---|
| 5,827,370 A | 10/1998 | Gu |
| 6,156,667 A | 12/2000 | Jewett |
| 6,187,072 B1 | 2/2001 | Cheung et al. |
| 6,193,802 B1 | 2/2001 | Pang et al. |
| 6,255,222 B1 | 7/2001 | Xia et al. |
| 6,354,241 B1 | 3/2002 | Tanaka et al. |
| 6,360,685 B1 | 3/2002 | Xia et al. |
| 6,366,346 B1 | 4/2002 | Nowak et al. |
| 6,517,786 B1 | 2/2003 | Best et al. |
| 6,680,420 B2 | 1/2004 | Pang et al. |
| 7,037,376 B2 | 5/2006 | Harvey et al. |
| 7,060,234 B2 | 6/2006 | Pokharna et al. |
| 7,494,628 B2 | 2/2009 | Pokharna et al. |
| 7,964,040 B2 | 6/2011 | Rasheed et al. |
| 8,747,762 B2 | 6/2014 | Dickinson et al. |
| 8,852,520 B2 | 10/2014 | Hur et al. |
| 9,314,824 B2 | 4/2016 | Gu et al. |
| 9,472,381 B2 | 10/2016 | Hur et al. |
| 9,597,634 B2 | 3/2017 | Dickinson et al. |
| 9,649,592 B2 | 5/2017 | Cox et al. |
| 9,867,238 B2 | 1/2018 | Cox et al. |
| 10,115,571 B2 | 10/2018 | Dickinson |
| 10,179,941 B1 | 1/2019 | Khan et al. |
| 10,187,966 B2 | 1/2019 | Wang et al. |
| 2003/0007910 A1 | 1/2003 | Lazarovich et al. |
| 2003/0027428 A1 | 2/2003 | Ng et al. |
| 2004/0131513 A1 | 7/2004 | Lazarovich et al. |
| 2005/0011445 A1 | 1/2005 | Upham |
| 2005/0194099 A1 | 9/2005 | Jewett, Jr. et al. |
| 2006/0107973 A1 | 5/2006 | Leung |
| 2006/0207630 A1 | 9/2006 | Sakai et al. |
| 2007/0095282 A1 | 5/2007 | Moon et al. |
| 2007/0286766 A1 | 12/2007 | Choi |
| 2008/0057726 A1 | 3/2008 | Kim |
| 2010/0192542 A1 | 8/2010 | Min et al. |
| 2011/0089017 A1 | 4/2011 | Hur et al. |
| 2013/0087287 A1 | 4/2013 | Hur et al. |
| 2013/0133697 A1 | 5/2013 | Stockman et al. |
| 2013/0146225 A1 | 6/2013 | Chen et al. |
| 2013/0164943 A1 | 6/2013 | Koshi et al. |
| 2015/0129047 A1 | 5/2015 | Gu et al. |
| 2015/0252472 A1 | 9/2015 | Ko et al. |
| 2015/0252473 A1 | 9/2015 | Dickinson |
| 2015/0314233 A1 | 11/2015 | Hur et al. |
| 2017/0173521 A1 | 6/2017 | Dickinson et al. |
| 2017/0221683 A1 | 8/2017 | Kim et al. |
| 2020/0286712 A1 | 9/2020 | Polak et al. |

FOREIGN PATENT DOCUMENTS

| | | |
|---|---|---|
| JP | H11222680 A | 8/1982 |
| JP | H0226804 A | 1/1990 |
| JP | 10168574 | 6/1998 |
| JP | H10168574 B1 | 6/1998 |
| JP | 2005175460 A | 6/2005 |
| JP | 2005303255 A | 10/2005 |
| JP | 2010234195 A | 10/2010 |
| JP | 2010247126 A | 11/2010 |
| JP | 2013089537 A | 5/2013 |
| KR | 1020090028991 A | 3/2009 |
| WO | 2009097068 A1 | 8/2009 |
| WO | 2011092186 A1 | 8/2011 |
| WO | 2015160057 A1 | 10/2015 |

OTHER PUBLICATIONS http://www.appliedmaterials.com/nanochip/nanochip-fab-solutions/july2016/new-aeris-s-teclmology-helps-increase- subfab-safety-while-reducing-emissions, 6 pages, accessed Oct. 1, 2019.

http://www.appliedmaterials.com/products/aeris-si. 3 pages, accessed Oct. 1, 2019.

http://www.appliedmaterials.com/products/aeris-g-plasma-abatement-system. 5 pages, accessed Oct. 1, 2019.

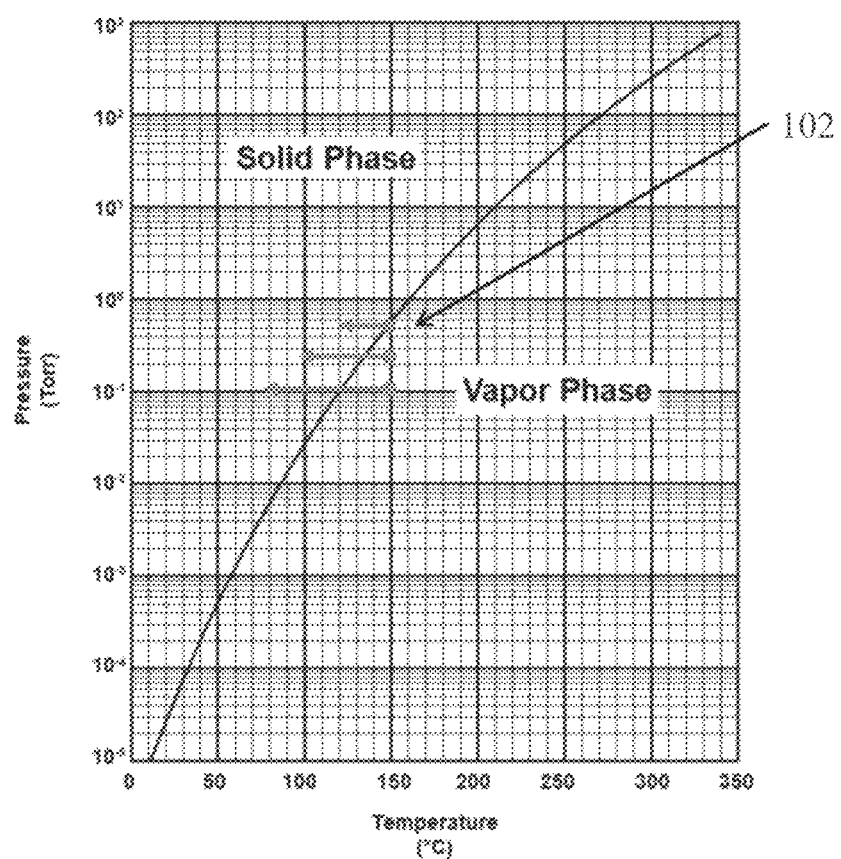
FIG. 1 - Prior Art

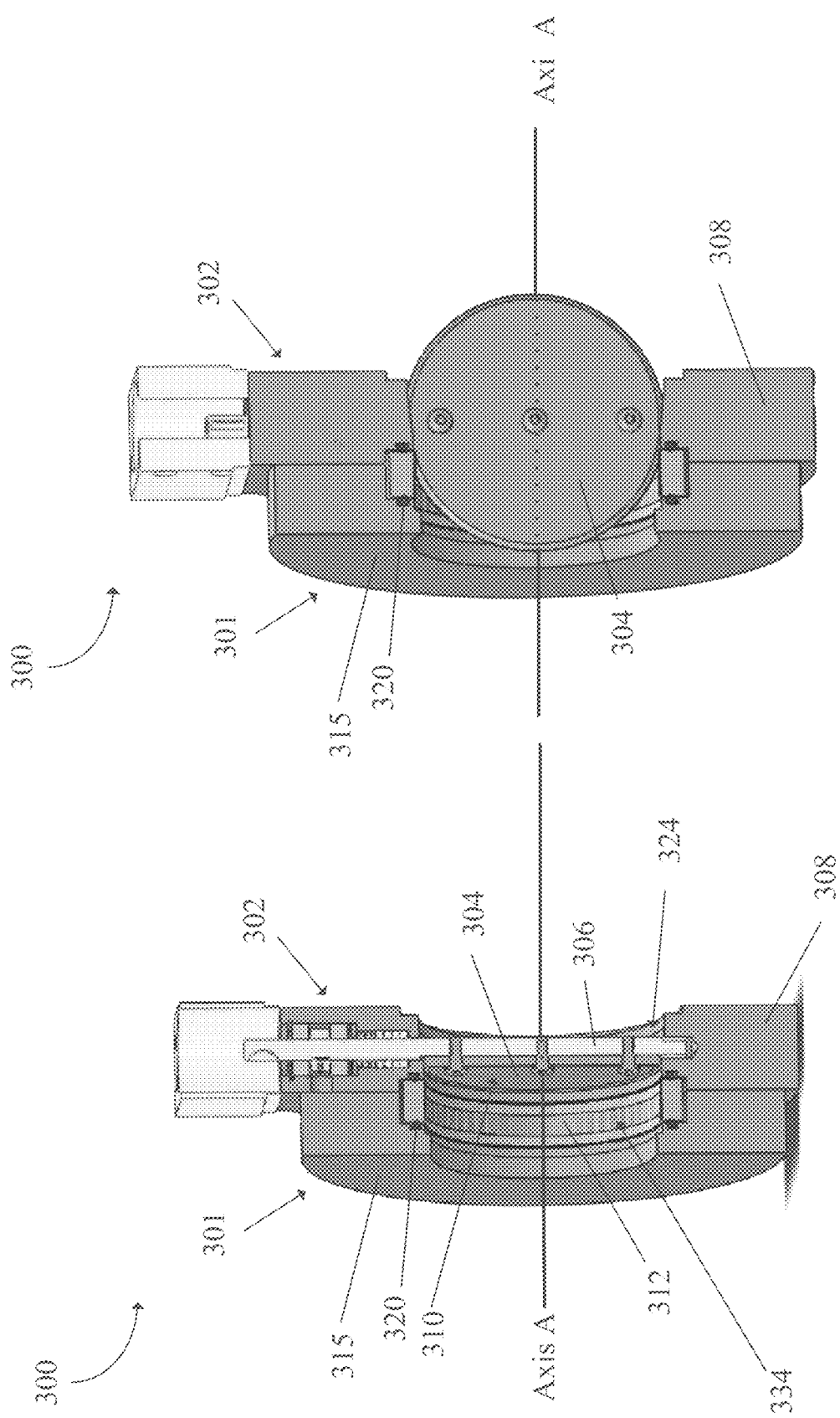

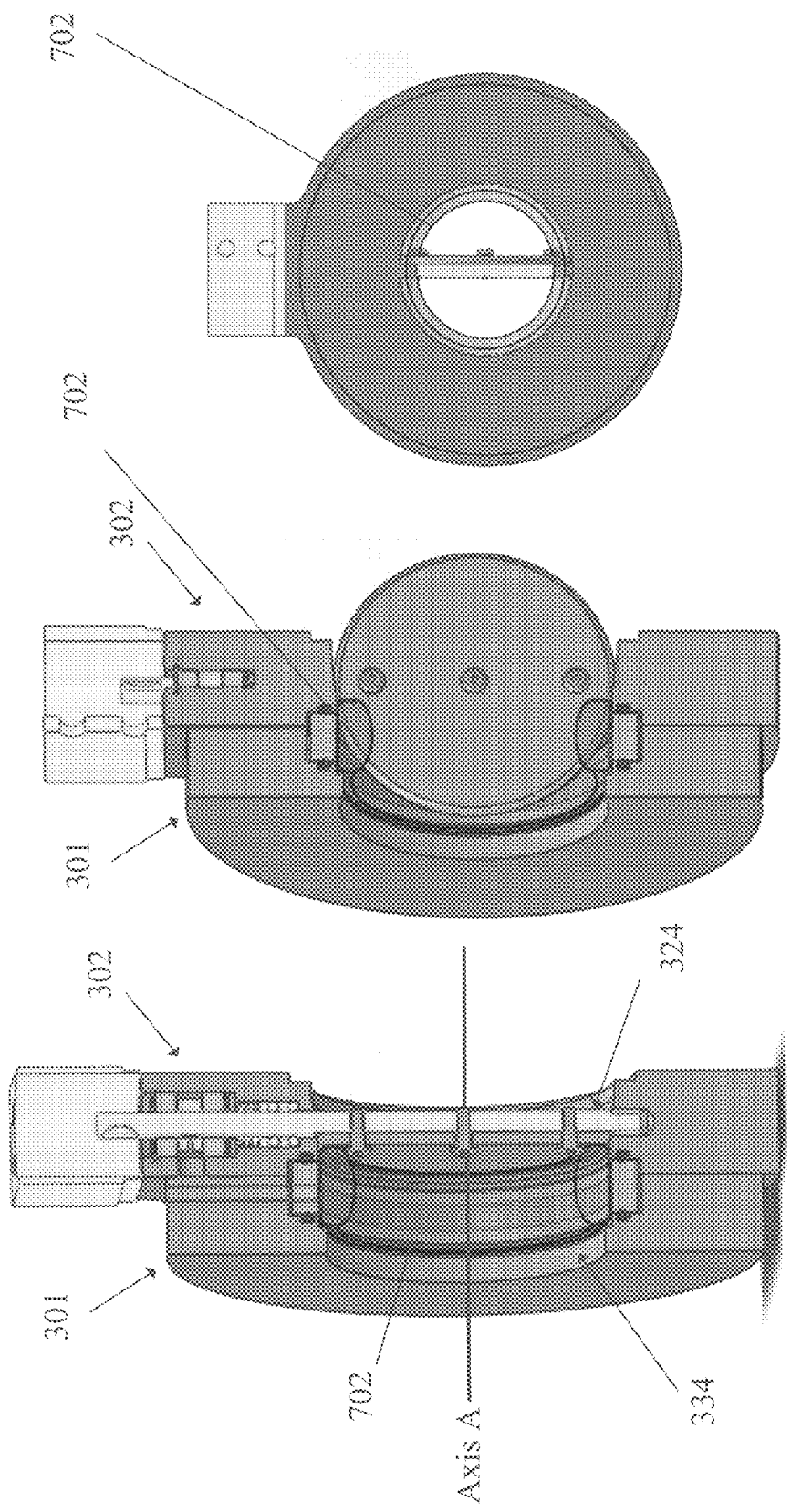

METHOD AND APPARATUS FOR DEPOSITION CLEANING IN A PUMPING LINE

CROSS REFERENCE TO RELATED APPLICATION

This application is a continuation of U.S. Ser. No. 16/679,640, filed Nov. 11, 2019, issued as U.S. Pat. No. 11,024,489 on Jun. 1, 2021, which is a divisional of U.S. Ser. No. 15/404,457, filed Jan. 12, 2017, issued as U.S. Pat. No. 10,535,506 on Jan. 14, 2020, which is a continuation in part of U.S. Ser. No. 14/994,668, filed Jan. 13, 2016, issued as U.S. Pat. No. 10,337,105 on Jul. 2, 2019. These applications are owned by the assignee of the instant application and are incorporated herein by reference in their entirety.

FIELD OF THE INVENTION

The invention generally relates to a plasma source configured to generate localized plasma to clean at least a portion of a pumping line in a semiconductor processing environment.

BACKGROUND

Deposition processes, including chemical vapor deposition (CVD) processes, are commonly used in the manufacturing of semiconductor devices. For example, in a typical CVD process, reactant gases are introduced into a reaction chamber and directed to a heated substrate to induce controlled chemical reactions, which result in the deposition of a thin film on the surface of the substrate. During the deposition process, chamber pressure is precisely controlled by one or more mechanical devices, such as vacuum valves, connected downstream from the reaction chamber. For example, an isolation valve is typically connected directly to the exhaust gas port of the reaction chamber, a throttle valve is situated downstream from the isolation valve, and a vacuum pump is located further downstream from both of the isolation and throttle valves. The plumbing between the reaction chamber and the vacuum pump (e.g., the pipelines and valves) is generally referred to as a foreline, a roughing line or a vacuum pumping line.

During a deposition, process, the throttle valve can cycle between open and closed positions to regulate the gas pressure inside of the reaction chamber. Most of the material produced from the reactant gases is deposited on the substrate surface in the reaction chamber. However, some material is also deposited on surfaces outside of the reaction chamber, such as on the throttle valve. As unwanted material accumulates on the throttle valve, the throttle valve's useful life can be reduced by, for example, introduction of seal wear, load addition, requirement for high torque drive systems, and alteration of conductance characteristics. Ultimately, unwanted material deposits on a throttle valve diminish the precise operation of the valve, thereby reducing the valve's ability to control gas pressure inside of the reaction chamber. Other vacuum valves along the vacuum pumping line can be similarly affected by unwanted material deposition. In addition, the position of a throttle valve during closed loop pressure control can provide useful diagnostic information. However, because valve position varies with quantity of deposition, unwanted deposition on a valve can limit the usefulness of valve positioning as an indication of other changes in the system.

Typically, an operator needs to manually remove valves in a mechanical system for cleaning or replacement. This requires downtime of the tool and venting of the foreline plumbing. Alternatively, remote plasma sources have been used for pump and foreline cleaning, where the plasma output is directed at the foreline, but not so close to the valves as to provide optimized and targeted component cleaning.

Further, during a wafer deposition process, unwanted material produced from the reactant gases can also be deposited along the vacuum pumping line as the reactant gases are pumped out from the processing chamber through the pumping line. Similar to the throttle valve, accumulation of the unwanted material in the vacuum pumping line can produce a host of problems, including clogging the pumping line and other downstream equipment, interfering with normal operation of the associated vacuum pump, reducing the vacuum pump's useful life, and contaminating processing steps in the processing chamber.

SUMMARY

Therefore systems and methods are needed to provide automatic, targeted cleaning of a valve (e.g., a throttle valve) and prevent deposition on the valve in the first place. The present invention provides an assembly for generating localized plasma that can substantially eliminate accumulated deposition on a valve and prevent future deposition. For example, the present invention provides a plasma source integrated with a valve to create a localized plasma at one or more target locations where deposition is problematic for the valve.

Further, systems and methods are needed to provide automated cleaning of a vacuum pumping line and prevent deposition in the pumping line. The present invention provides one or more assemblies for generating localized plasmas in a vacuum pumping line that can substantially eliminate accumulated deposition on the line and prevent future depositions. For example, the present invention provides one or more plasma sources integrated with a vacuum pumping line to create a localized plasma for cleaning one or more segments of the line without interfering with the function of the line, such as reducing the pumping speed or conductance along the pumping line or obstructing the pumping path.

In one aspect, a valve assembly is provided that comprises a vacuum valve including an electrically grounded surface and an electrode adjacent to the electrically grounded surface of the vacuum valve. The valve assembly also includes a barrier dielectric, a least a portion of which is located between the electrode and the electrically grounded surface. The valve assembly further includes a dielectric barrier discharge structure formed from the electrically grounded surface, the electrode, and the barrier dielectric. The dielectric barrier discharge structure is adapted to generate a plasma on the electrically grounded surface to process at least a portion of the vacuum valve.

In some embodiments, the valve assembly further comprises a buried electrode assembly including the electrode, the barrier dielectric and an isolator dielectric. A body of the vacuum valve and the buried electrode assembly can be substantially cylindrical, such that the body and the buried electrode assembly are concentrically aligned along a longitudinal axis. In some embodiments, the valve assembly further includes an extension portion coupled to the body of the vacuum valve for securing the buried electrode assembly against the vacuum valve.

In some embodiments, the electrode is formed on an interior surface of the barrier dielectric. In some embodiments, the electrically grounded surface forms a grounded electrode for generating the plasma. The electrode or the electrically grounded surface can include at least a portion of a control element of the vacuum valve. In some embodiments, the vacuum valve assembly further comprises a power supply connected between the electrode and the electrically grounded surface for generating the plasma.

In some embodiments, the vacuum valve comprises at least one of a throttle valve, isolation valve or pendulum valve. In some embodiments, the barrier dielectric comprises at least one of quartz, alumina, aluminum nitride, glass or polymide.

In some embodiments, the vacuum valve, the electrode and the barrier dielectric comprise a unitary structure. Alternatively, each of the vacuum valve or the electrode is a replaceable consumable.

In another aspect, a method is provided that includes providing a vacuum valve including a body and a control element, electrically grounding a surface of at least one of the body or the control element to form an electrically grounded surface, and locating an electrode adjacent to the electrically grounded surface of the vacuum valve. The method also includes inserting at least a portion of a barrier dielectric between the electrode and the electrically grounded surface of the vacuum valve, and creating a dielectric barrier discharge structure using the electrode, the barrier dielectric, and the electrically grounded surface. The dielectric barrier discharge structure is adapted to generate a localized plasma coupled to the vacuum valve for processing at least a portion of the vacuum valve.

In some embodiments, the method further includes locating the electrode on an interior surface of the barrier dielectric. In some embodiments, the method further includes securing the electrode and the barrier dielectric against the body of the vacuum valve.

In some embodiments, the method further includes providing a high voltage alternative current (AC) between the electrode and the electrically grounded surface to generate the localized plasma. In some embodiments, a power of the localized plasma is about 15 Watts at about 2 Torr.

In some embodiments, the method further includes locating the vacuum valve and the dielectric barrier discharge structure downstream from a wafer processing chamber. The method can further include using the localized plasma to clean the at least a portion of the vacuum valve in at least one of a prevention mode during an operation of the wafer processing chamber or an elimination mode after an operation of the wafer processing chamber. The localized plasma can also be used to clean at least a portion of a roughing line adjacent to the vacuum valve.

The prevent mode can comprise generating a primary plasma in the wafer processing chamber in connection with performance of a wafer deposition process within the wafer processing chamber, generating, in connection with the wafer deposition process within the wafer processing chamber, a gaseous byproduct that flows from the wafer processing chamber to the vacuum valve, and generating the localized plasma coupled to the vacuum valve, during the performance of the wafer deposition process within the wafer processing chamber, to prevent condensation of the gaseous byproduct to solid deposits on the vacuum valve.

The elimination mode can include generating a primary plasma in the wafer processing chamber in connection with execution of a wafer deposition process within the wafer processing chamber, generating, in connection with the wafer deposition process within the wafer processing chamber, solid deposits on the vacuum valve, and generating the localized plasma coupled to the vacuum valve, after the execution of the wafer deposition process, to substantially etch away the solid deposits on the vacuum valve. In some embodiments, the elimination mode further includes supplying a cleaning gas to the vacuum valve prior to and/or while generating the localized plasma.

In another aspect, a vacuum pumping line plasma source is provided. The plasma source includes a body defining a generally cylindrical interior volume extending along a central longitudinal axis. The body has an input port for coupling to an input pumping line, an output port for coupling to an output pumping line, and an interior surface disposed about the generally cylindrical interior volume. The plasma source also includes a supply electrode disposed adjacent to a return electrode and a barrier dielectric member, a least a portion of which is positioned between the supply electrode and the return electrode. The plasma source further includes a dielectric barrier discharge structure formed from the supply electrode, the return electrode, and the barrier dielectric member. At least a portion of the dielectric barrier discharge structure is disposed in the body or on the interior surface of the body, and the dielectric barrier discharge structure is adapted to generate a plasma in the generally cylindrical interior volume.

In some embodiments, the return electrode is electrically grounded. In some embodiments, the return electrode comprises an electrically grounded portion of the body of the plasma source. In some embodiments, the return electrode and the supply electrode are embedded in the barrier dielectric member.

In some embodiments, the generally cylindrical interior volume extends substantially straight along the central longitudinal axis. In some embodiments, at least one of the supply electrode, the barrier dielectric member or the return electrode defines the generally cylindrical interior volume. The supply electrode and the return electrode can maintain about the same radial distance to the central longitudinal axis.

In some embodiments, the plasma source further includes a cooling channel embedded in the body. The cooling channel is configured to conduct a cooling liquid through the body. In some embodiments, the plasma source further comprises one or more fins disposed on an exterior surface of the body for cooling the body.

In some embodiments, the plasma source further comprises a plurality of supply electrodes and a plurality of return electrodes positioned in an alternating arrangement along the central longitudinal axis.

In some embodiments, the plasma source further comprises a secondary port disposed in the body and spaced from the input port and the output port. The secondary port is configured to conduct a gas flow into the generally cylindrical interior volume of the body.

In yet another aspect, a method of manufacturing a vacuum pumping line plasma source is provided. The method includes providing a body defining a generally cylindrical interior volume extending along a central longitudinal axis. The body has an input port for coupling to an input of a pumping line, an output port for coupling to an output of the pumping line, and an interior surface disposed about the central longitudinal axis for defining the generally cylindrical interior volume. The method also includes locating a supply electrode adjacent to a return electrode, and positioning at least a portion of a barrier dielectric member between the supply electrode and the return electrode. The method further includes creating a dielectric barrier discharge structure using the supply electrode, the return electrode, and the barrier dielectric member. At least a portion of the dielectric barrier discharge structure is disposed in the body or on the interior surface of the body, and the dielectric barrier discharge structure is adapted to generate a localized plasma in the generally cylindrical interior volume.

In some embodiments, the method of manufacturing a vacuum pumping line plasma source further comprises grounding the return electrode. In some embodiments, the method further comprises forming the return electrode by electrically grounding at least one portion of the body. In some embodiments, the method further comprises embedding at least one of the return electrode or the supply electrode in the barrier dielectric member. In some embodiments, the method further comprises locating the supply electrode, the return electrode and the barrier dielectric member in the body or on the interior surface of the body.

In some embodiments, the dielectric barrier discharge structure can be configured to generate the localized plasma with a power of about 20 watts to about 1000 watts.

In some embodiments, the generally cylindrical interior volume is coaxial with the pumping line.

In some embodiments, a co-fire technique is used to integrally form at least a portion of the dielectric barrier discharge structure including an isolation dielectric member, the barrier dielectric member, and the supply electrode. The barrier dielectric member and the isolation dielectric member can comprise one or more ceramic materials.

In yet another aspect, a method is provided for cleaning a pumping line having a plurality of inline plasma sources coupled thereto. The method includes supplying a cleaning gas to the pumping line from a wafer processing chamber connected to the pumping line and generating a localized plasma at one or more of the plurality of inline plasma sources using the cleaning gas flowing in the pumping line, where each localized plasma is adapted to clean at least a portion of the pumping line. The method further includes determining one or more impedances of the localized plasma at the one or more inline plasma sources, and monitoring the one or more impendences to detect an endpoint of the cleaning.

In some embodiments, at least one of the plurality of inline plasma sources is upstream from a throttle valve of the pumping line. An inline plasma source can be space about 2 meters to about 3 meters from an adjacent plasma source in the plurality of inline plasma sources.

In some embodiments, detecting an endpoint of the cleaning comprises determining a steady state of at least one of the monitored impedances. The supply of the cleaning gas to the pumping line can be stopped after detecting the endpoint. Further, the localized plasma at the one or more inline plasma sources can be turned off after detecting the endpoint.

In some embodiments, at least one of a voltage or a current of each localized plasma is monitored, based on which the one or more impedances are determined.

In some embodiments, the localized plasma is formed on an interior surface of each inline plasma source, which defines a generally cylindrical interior volume that forms a section of the pumping line. A conductance can be substantially constant along the pumping line and the generally cylindrical interior volumes of the inline plasma sources.

In some embodiments, a second cleaning gas is injected into an interior volume of at least one of the inline plasma sources via a port of the at least one inline plasma source. The second cleaning gas can be directed in a distributed flow pattern and/or an annular flow pattern along a wall of the pumping line.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the technology.

FIG. 1 shows an exemplary phase diagram of ammonium chloride, which is a common byproduct in a foreline.

FIGS. 3a and b show sectional views of an exemplary valve assembly including a buried electrode assembly coupled to a throttle valve illustrated in closed and open positions, respectively.

FIGS. 7a and b show sectional views of the valve assembly of FIGS. 3a and b with a localized plasma generated to process the throttle valve that is illustrated in closed and open positions, respectively.

FIG. 8 shows a top view of the valve assembly of FIGS. 7a and b comprising the localized plasma.

DETAILED DESCRIPTION

Figure 2A:
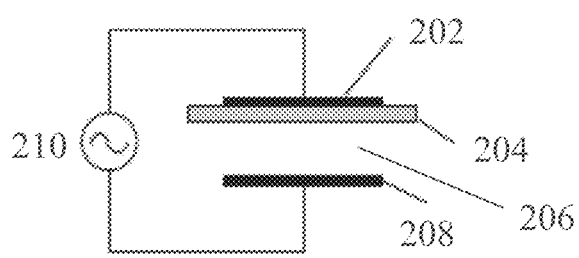
FIGS. 2a-c show several exemplary dielectric barrier discharge configurations based on which the valve assembly of the present invention can be constructed.

In a deposition process, there are generally two types of chemical reactions that can create unwanted material deposition on components (e.g., a throttle valve) along a foreline (also referred to as a vacuum pumping line) or within the foreline itself. One type of chemical reactions is rate limited reactions, where not most or all reactants (e.g., input gases) in the reaction chamber are consumed at the wafer plane. Instead, the reactions that are intended to occur on the wafer can also occur further downstream and/or outside of the chamber. For example, gases supplied to the reaction chamber can continue to react when pumped out of the chamber. A wall interaction can increase the likelihood of such rate limited reactions, where two gas reactants are pumped out of the reaction chamber and adhere to the same surface, on which reaction subsequently occurs to generate byproducts. In some cases, a wall interaction is more likely to occur on the surface of a control element of a valve (e.g., on the backside of the flapper of a throttle valve) due to eddy current flow pattern of gases being pumped out of the reaction chamber. In some cases, high pressure (e.g., sub-atmospheric pressure) processes are more likely to experience rate limited reactions. The byproducts generated from rate limited reactions can be in the form of solids and/or vapor. Another type of chemical reaction is reactant limited, where gas reactants are consumed on the wafer in the reaction chamber and byproducts from the reactions, possibly in a solid form, are pumped from the reaction chamber and exit downstream through the foreline. In some cases, a reactant limited reaction can result in a more chemically stable byproduct in comparison to a byproduct from a rate limited reaction. Transitions between rate limited reactions and reactant limited reactions can be manipulated with process temperature and pressure. Generally, solid and/or vapor byproducts generated from both rate limited reactions and reactant limited reactions can become unwanted material deposition on one or more components of the foreline or in the foreline itself.

FIG. 1 shows an exemplary phase diagram of ammonium chloride, which is a common, chemically-stable byproduct in a foreline that can be produced from a reactant limited reaction. As shown, a relatively small temperature drop in the foreline, such as in the range of about 10 C to 30 C, can lead to condensation 102 of ammonium chloride from vapor to solid, which is a form that allows the byproduct to easily accumulate on one or more surfaces in the foreline as unwanted deposits. In addition, a foreline pressure of greater than about 200 m Torr, when the foreline is heated to about 150 C, which is a common process condition, allows little margin for gas cooling before such undesirable condensation occurs. Therefore, cooling along the foreline can accelerate material deposition on the components in the foreline. For example, because velocity in a throttle valve can dramatically increase at throttle point, this may lead to a decrease in enthalpy, lower gas temperature, and cooling near the throttle valve due to conservation of energy. Moreover, according to the theory of Joule-Thomson cooling, even with constant enthalpy, non-ideal gas behavior can cause temperature to drop, where the amount of drop is highly dependent on gas, pressure and/or temperature conditions. As illustrated by the exemplary phase diagram of ammonium chloride in FIG. 1, a drop in temperature around the throttle valve can cause the byproduct to change from vapor to solid that is easily deposited on the throttle valve. Therefore, to prevent deposition on foreline components and/or on the foreline, systems and methods are needed to increase the environmental temperature so as to maintain gaseous byproducts in a vapor state. In addition, systems and methods are needed to reduce/eliminate solid byproducts already deposited on the components.

In one aspect, a valve assembly is provided that includes a dielectric barrier discharge structure integrated with a valve, where the valve assembly can generate a localized plasma to prevent deposition on the valve (e.g., by maintaining gaseous byproducts in its vapor form) and/or etch away existing deposits on the valve (e.g., by interacting with at least one cleaning gas). The valve suitable for use in the valve assembly can be any type of valve, such as a vacuum valve, which can be a throttle valve, isolation valve or pendulum valve.

Figure 2B:
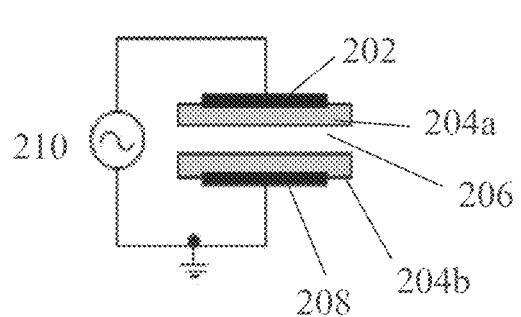
Figure 2C:
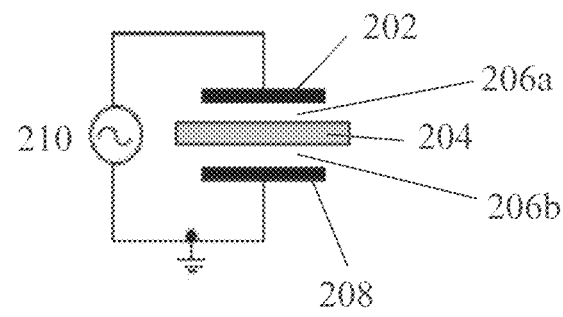

FIGS. 2a-c show several exemplary dielectric barrier discharge configurations based on which the valve assembly of the present invention can be constructed. As shown, a dielectric barrier discharge generally includes an electrode 202, at least one barrier dielectric layer 204, at least one discharge gap 206, and an electrically grounded electrode 208. A power supply 210 is connected between the electrode 202 and the ground electrode 208. There are several possible arrangements of the barrier dielectric layer(s) 204 and the discharge gap(s) 206 in a dielectric barrier discharge structure. For example, as shown in FIG. 2a, a barrier dielectric layer 204 can physically contact the electrode 202 with the discharge gap 206 situated between the barrier dielectric 204 and the ground electrode 208. In FIG. 2b, two barrier dielectric layers 204a, 204b can physically contact each of the electrodes 202, 208, with the barrier discharge gap 206 sandwiched between the two barrier dielectric layers. In FIG. 2c, the barrier dielectric layer 204 is physically isolated from both of the electrodes 202, 208 by discharge gaps 206a and 206b. Other dielectric barrier discharge structures are possible and are within the scope of the present invention. In operation, as the power supply 208 provides a high-voltage, alternative current (AC) between the electrode 202 and the ground electrode 208, charges migrate through the barrier dielectric layer(s) 204 and collect on the surface of these layer(s) 204. When surface potential reaches a breakdown threshold voltage, a large number of small discharges occur every half cycle of the AC waveform to generate a plasma. The plasma is sustained if the continuous energy source provides the required degree of ionization, overcoming the recombination process leading to the extinction of the discharge plasma.

Figure 4:
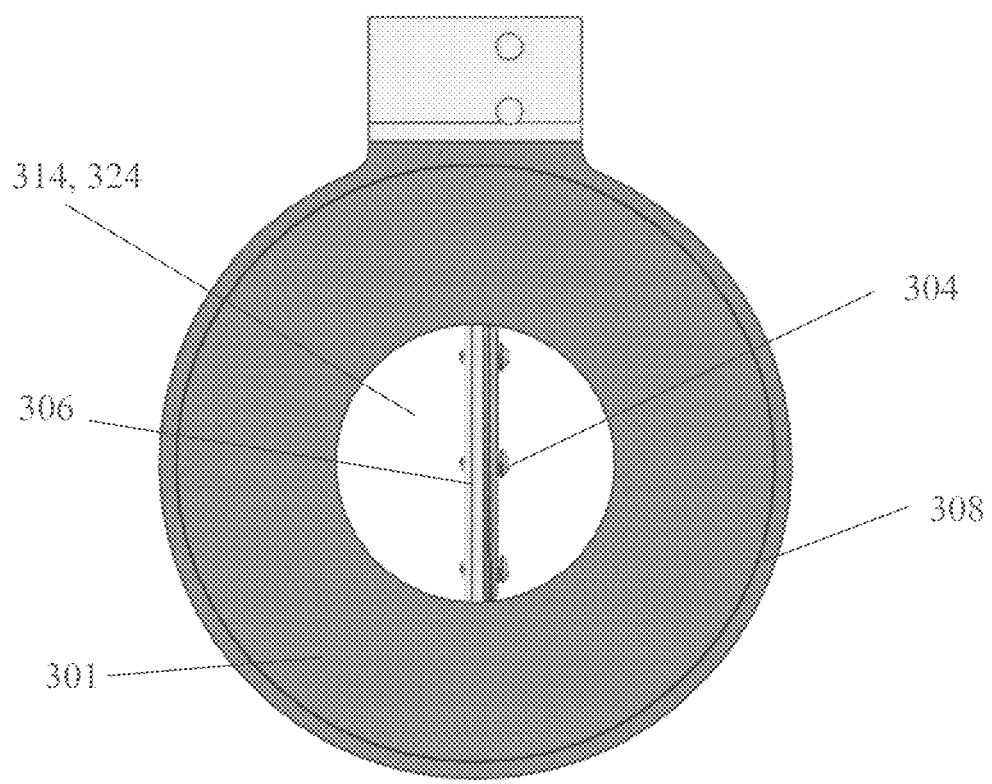
FIG. 4 shows a top view of the valve assembly of FIGS. 3a and b with the throttle valve in the open position.

FIGS. 3a and b show sectional views of an exemplary valve assembly 300 including a buried electrode assembly 301 coupled to a throttle valve 302 illustrated in closed and open positions, respectively. FIG. 4 shows a top view of the valve assembly 300 of FIGS. 3a and b with the throttle valve 302 in the open position. As shown, the throttle valve 302 of the valve assembly 300 includes a control element 304 (e.g., a circular flapper), a shaft 306 used to rotate the control element 304 between open and closed positions, and a body 308 through which gas flows when the control element 304 is in the open position. The body 308 of the throttle valve 302 can be cylindrical and disk-shaped with a central opening 324 to accommodate the movement of the control element 304. The valve body 308 can be made of stainless steel or anodized aluminum, for example. The valve body 308 defines a longitudinal axis A extending through the opening 324. Conductance of the throttle valve 302 is a function of the distance between the inside surface of the body 308 (i.e., the surface on the circumference of the opening 324) and the circumference of the control element 304.

At least one surface of the throttle valve body 308, the control element 304 or the shaft 306 can be electrically grounded. In some embodiments, once a surface of the valve body 308 is electrically grounded, the entire valve body 308 becomes electrically grounded. In general, an electrically grounded surface 310 refers to a grounded surface of the throttle valve 302 to which a localized plasma is directed due to the placement of the buried electrode assembly 301 in relation to the throttle valve 302. Because plasma tries to occupy the lowest energy state possible, it tends to discharge from the buried electrode assembly 301 to whatever grounded surface that is the closest to the buried electrode assembly 301. Therefore, by selectively positioning the buried electrode assembly 301 in relation to the throttle valve 302, an operator can perform targeted, in-situ cleaning of desired portions of the valve 302 with an integrated plasma source. In some cases, the electrically grounded surface 310 can be a "wetted" surface or "interior vacuum exposed" surface of the throttle valve 302. The electrically grounded surface 310 can be located on the control element 304, the throttle valve body 308, the shaft 306, or another surface on or close to the throttle valve 302 that supports an electrical discharge.

Figure 5:
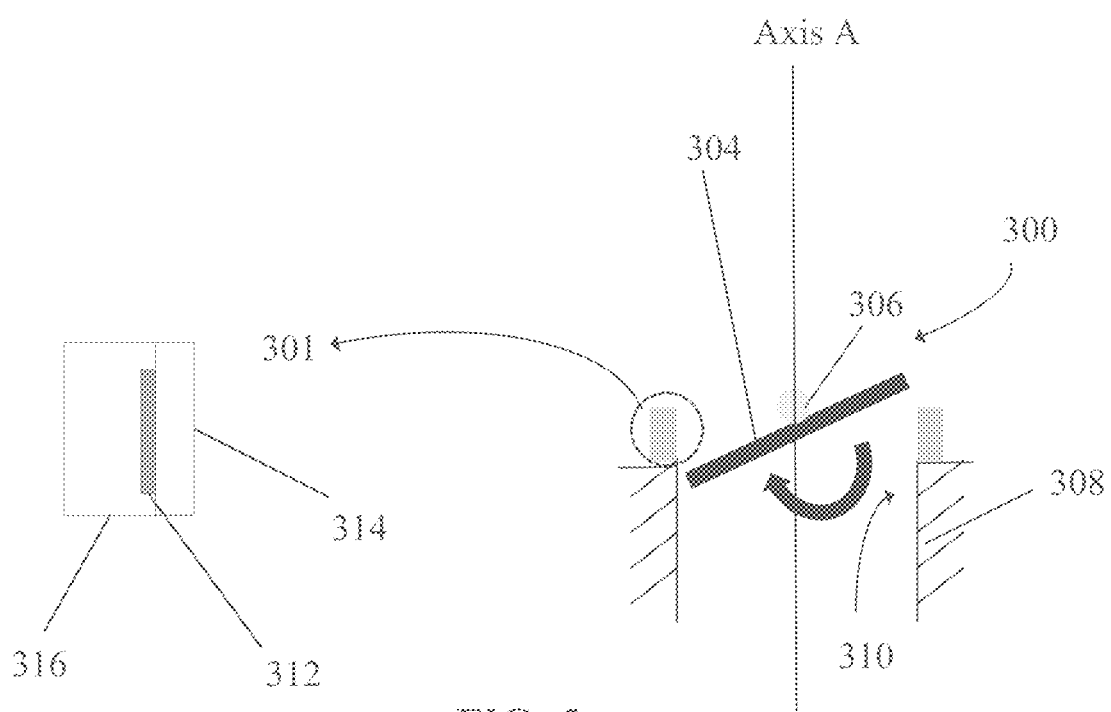
FIG. 5 shows a detailed view of at least a portion of the buried electrode assembly within the valve assembly of FIGS. 3a and b.

FIG. 5 shows a detailed view of at least a portion of the buried electrode assembly 301 of FIGS. 3a and b within the valve assembly 300. As shown, the buried electrode assembly 301 includes an electrode 312, a barrier dielectric 314, and an isolator dielectric 316. The electrode 312 is sandwiched between the isolator dielectric 316 and the barrier dielectric 314 such that the electrode 312 is formed on the interior surfaces of the two components. In some embodiments, the buried electrode assembly 301 radially surrounds the control element 304 of the throttle valve 302, where the barrier dielectric 314 is closest to the control element 304 in the radial direction (i.e., a direction that is perpendicular to the longitudinal Axis A) and the isolator dielectric 316 is furthest away from the control element 304 in the radial direction. The electrode 312 is also adjacent to the electrically grounded surface 310 on or close to the throttle valve 302 with at least a portion of the barrier dielectric 314 located between the electrode 312 and the electrically grounded surface 310. In some embodiments, at least one of the isolator dielectric 316 or the barrier dielectric 314 is made of quartz, alumina, a ceramic material (e.g., aluminum nitride), glass or a stable polymer such as polymide (e.g., Klypton). In some embodiments, the electrode 312 is made of tungsten.

With reference to FIGS. 3a and b, the buried electrode assembly 301 can be similarly shaped as the body 308 of the throttle valve 302 (e.g., cylindrical and disk-shaped) such that the two components 301, 308 can concentrically align and stack together along the longitudinal axis A. Specifically, the disk-shaped buried electrode assembly 301 can have a circular, central opening 334 that substantially aligns with the central opening 324 of the valve body 308 along the longitudinal axis A when the buried electrode assembly 301 is attached to the valve 302. In some embodiments, the electrode 312, barrier dielectric 314, and isolator dielectric 316 are cylindrical and can be concentrically arranged about the longitudinal Axis A to form the buried electrode assembly 301, where the electrode 312 substantially surrounds the barrier dielectric 314 and the isolator dielectric 316 substantially surrounds the electrode 312. In some embodiments, the buried electrode assembly 301 includes an extension portion 315, made of stainless steel, for example, configured to secure the buried electrode assembly 301 against the throttle valve 302. In some embodiments, one or more vacuum seals 320 can be used to attach a substrate of the electrode 312 to the valve body 308.

Generally, the valve assembly 300 includes a dielectric barrier discharge structure that is created based on the electrically grounded surface 310 and the buried electrode assembly 301. A power supply (not shown) can be connected between the electrode 312 of the buried electrode assembly 301 and the electrically grounded surface 310 to generate a localized plasma that is directed toward the electrically grounded surface 310 to clean the surface and its vicinity. In some embodiments, the dielectric barrier discharge structure of the valve assembly 300 can be configured to have similar geometry and construction as one of the dielectric barrier discharge configurations of FIGS. 2a-c by suitable arranging the electrode 312, the isolator dielectric 316, and/or the barrier dielectric 314 in relation to the electrically grounded surface 310. For example, the electrically grounded surface 310 can serve substantially the same function as the electrically grounded electrode 208, the electrode 312 can be constructed to be substantially the same as the electrode 202, and the barrier dielectric 314 can be constructed to be substantially the same as the barrier dielectric layer(s) 204. In addition, a gap between the the buried electrode assembly 301 and the grounded surface 310 of the throttle valve 302 can serve as a discharge gap, similar to the discharge gap 206 of FIGS. 2a-c.

Figure 6A:
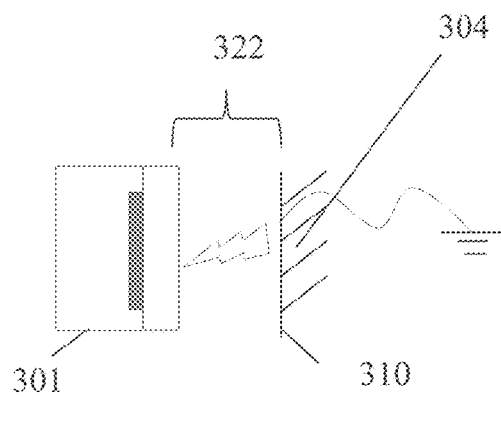
FIGS. 6a-d show various exemplary electrically grounded surfaces that support electrical discharge and plasma formation in relation to the buried electrode assembly of FIGS. 3a and b.
Figure 6B:
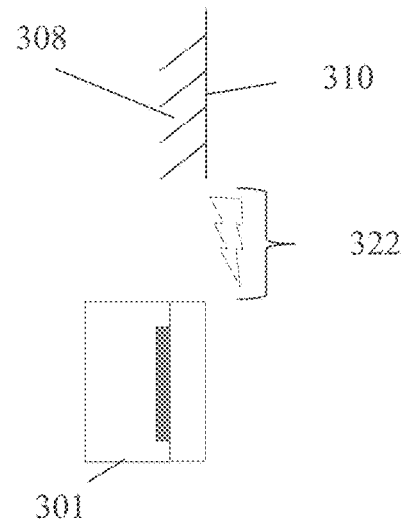
Figure 6C:
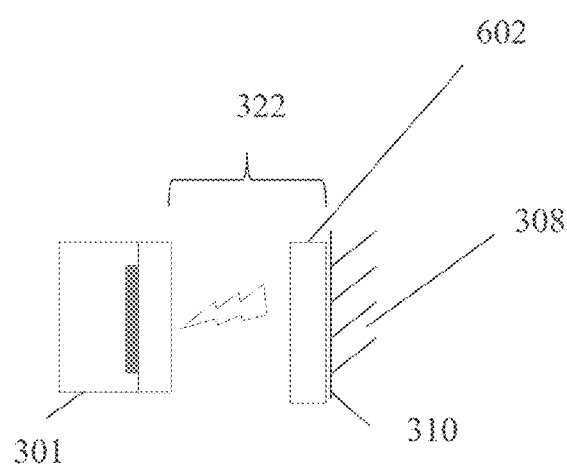
Figure 6D:
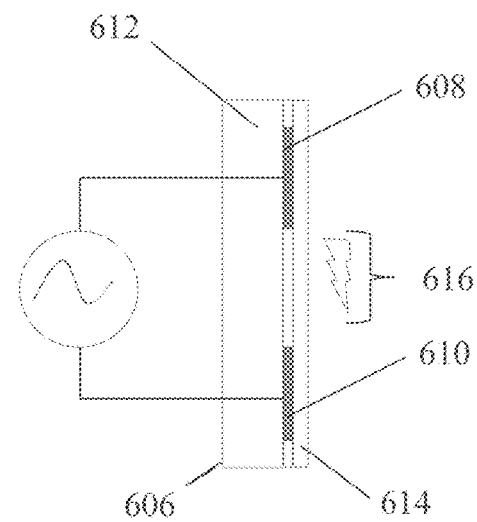

As described above, the electrically grounded surface 310 can be any surface on or close to the throttle valve 302 that supports an electrical discharge, so long as the buried electrode assembly 301 is located sufficiently close to the electrically grounded surface 310 to form a plasma through dielectric barrier discharge. FIGS. 6a-d show various exemplary electrically grounded surfaces 310 that support electrical discharge and plasma formation in relation to the buried electrode assembly 301. As described above, by selectively positioning the buried electrode assembly 301 in relation to the throttle valve 302, an operator can choose the electrically grounded surface 310 to which the resulting plasma discharge is targeted. In FIG. 6a, the electrically grounded surface 310 is located on the control element 304 of the throttle valve 302, and a plasma can be formed in the discharge gap 322 between the buried electrode assembly 301 and the grounded surface of the control element 304. In FIG. 6b, the electrically grounded surface 310 is located on an inner surface of the valve body 308 (e.g., the inner cylindrical surface of the central opening 324 of the valve body 308), and a plasma can be formed in the discharge gap 322 between the buried electrode assembly 301 and the grounded inner surface of the valve body 308. In FIG. 6c, a second, optional barrier dielectric 602 is inserted between the buried electrode assembly 301 and the electrically grounded surface 310 located on the valve body 308. This second barrier dielectric 602 can be used to reduce metallic sputtering in a barrier discharge. In some embodiments, the anodized layer of the anodized aluminum body can serve as the second barrier dielectric 602. The electrically grounded surface 310 can be located on the aluminum layer underlying the anodized layer. FIG. 6d shows a buried electrode assembly 606 where both the supply electrode 608 and the return (e.g., grounded) electrode 610 are integrated into one structure with a shared isolator dielectric 612 and a shared barrier dielectric 614. For example, the supply electrode 608 and the return electrode 610 can be disposed between the isolator dielectric 612 and the barrier dielectric 614. A discharge gap 616 can be formed between the supply electrode 608 and the return electrode 610.

FIGS. 7a and b show sectional views of the valve assembly 300 with a localized plasma 702 generated to process the throttle valve 303 that is illustrated in closed and open positions, respectively. FIG. 8 shows a top view of the valve assembly 300 comprising the localized plasma 702. As shown, the plasma discharge 702 is created between the electrode 312 (located along the inner cylindrical surface of the central opening 334 of the buried electrode assembly 301) and the adjacent grounded surface 310 (located on the inner cylindrical surface of the central opening 324 of the throttle valve body 308). The plasma 702 can be a thin circular layer created along the inner cylindrical surfaces of the central openings 324 and 334. The plasma 702 can be concentric with and/or parallel to at least one of the isolator dielectric 316, the electrode 312 or the barrier dielectric 314 of the buried electrode assembly 301 along the longitudinal axis A. In operation, the plasma discharge 702 heats the nearby valve 302, with the electrically grounded surface 310 exposed to the most amount of heat. In some embodiments, a plasma discharge generated by the valve assembly 300 can have a power of about 15 Watts at about 2 Torr.

In some embodiments, the buried electrode assembly 301 is formed on one component of the throttle valve 302, while the electrically grounded surface 310 is on another component of the throttle valve 302. For example, the buried electrode assembly 301 can be formed on the control element 304 (e.g., with the control element 304 being the electrode 312), in which case the grounded electrical surface 310 becomes at least a portion of the inner cylindrical surface of the central opening 324 of the throttle valve body 308. The reverse can also be constructed. Specifically, the buried electrode assembly 301 can be formed on the valve body 308 (e.g., with the valve body 308 being the electrode 312), while the grounded electrical surface 310 is located on the control element 304. In these cases, the electrode 312 or the electrically grounded surface 310 comprises at least a portion of the control element 304.

In some embodiments, the valve assembly 300 is a unitary structure having the the valve 302 and the buried electrode assembly 301 integrated as a single component. In some embodiments, each component of the valve assembly 300 (e.g., the valve 302 or the buried electrode assembly 301) is a consumable and can be separately replaceable. Further, components of the buried electrode assembly 301 (e.g., the isolator dielectric 316, electrode 312 or barrier dielectric 314) can be consumables and separately replaceable.

Even though the valve assembly 300 is described above with respect to a throttle valve, the valve assembly can be easily adapted to clean other types of vacuum valves, including an isolation valve or a pendulum valve. In general, a valve assembly of the present invention can include a buried electrode assembly and a valve. The buried electrode assembly can be constructed from an electrode and at least one barrier dielectric. A surface of the valve (or a surface close to the valve) can be electrically grounded. Thus, the valve assembly is able to create a dielectric barrier discharge from the electrically grounded surface and the buried electrode assembly. In operation, the dielectric barrier discharge produces a plasma charge to process the valve and its vicinity (e.g., at least a portion of the foreline on which the valve is located).

Figure 9A:
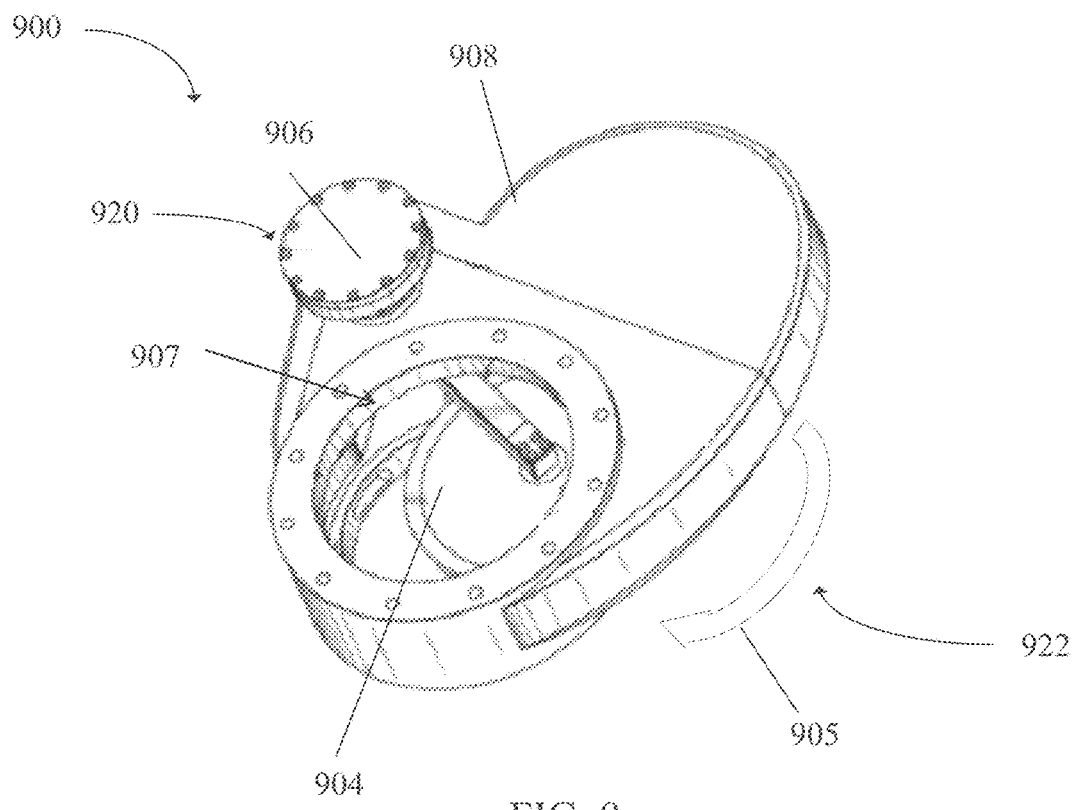
FIGS. 9a and b show side and cross-sectional views of an exemplary pendulum valve, respectively, based on which a valve assembly can be created to provide in-situ, localized processing of the valve.
Figure 9B:
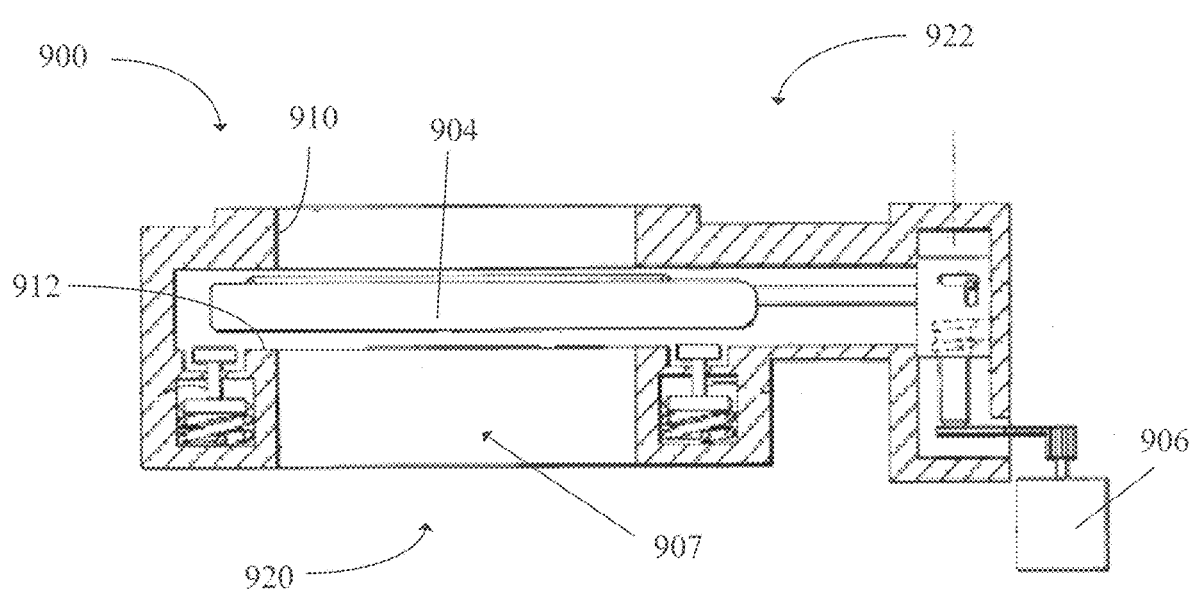

FIGS. 9a and b show side and cross-sectional views of an exemplary pendulum valve 900, respectively, based on which a valve assembly can be created to provide in-situ, localized processing of the valve 900. As shown, the pendulum valve 900 includes a control element 904 (e.g., a gate) and a shaft 906 used to rotate the control element 904 in a direction 905 between an open position to expose the opening 907 and a closed position to cover the opening 907. In addition, the pendulum valve 900 includes a body 908 through which gas flows when the control element 904 is in the open position. The valve body 908 generally defines a distal end 920 and a proximal end 922. The conductance of the pendulum valve 900 is a function of the amount of opening defined by the position of the control element 904 relative to the opening 907 disposed in the body 908.

At least one surface of the pendulum valve 900, including a surface of the valve body 908, the control element 904 or the shaft 906, can be electrically grounded to form an electrically grounded surface. For example, the electrically grounded surface can be located on a surface 910 along the circumference of the opening 907 that is proximal to the control element 904 (i.e., can be covered or uncovered by control element 904). As another example, the electrically grounded surface can be located on a surface 912 close to the opening 907 that is distal to the control element 904. Alternatively, the electrically grounded surface can be located on a surface (not shown) adjacent to the pendulum valve 900. In some embodiments, a buried electrode assembly (not shown), similar to the buried electrode assembly 301 described above with respect to the throttle valve 302, can be positioned adjacent to the pendulum valve 900 and the electrically grounded surface to generate a plasma discharge between the buried electrode assembly and the electrically grounded surface.

Figure 10:
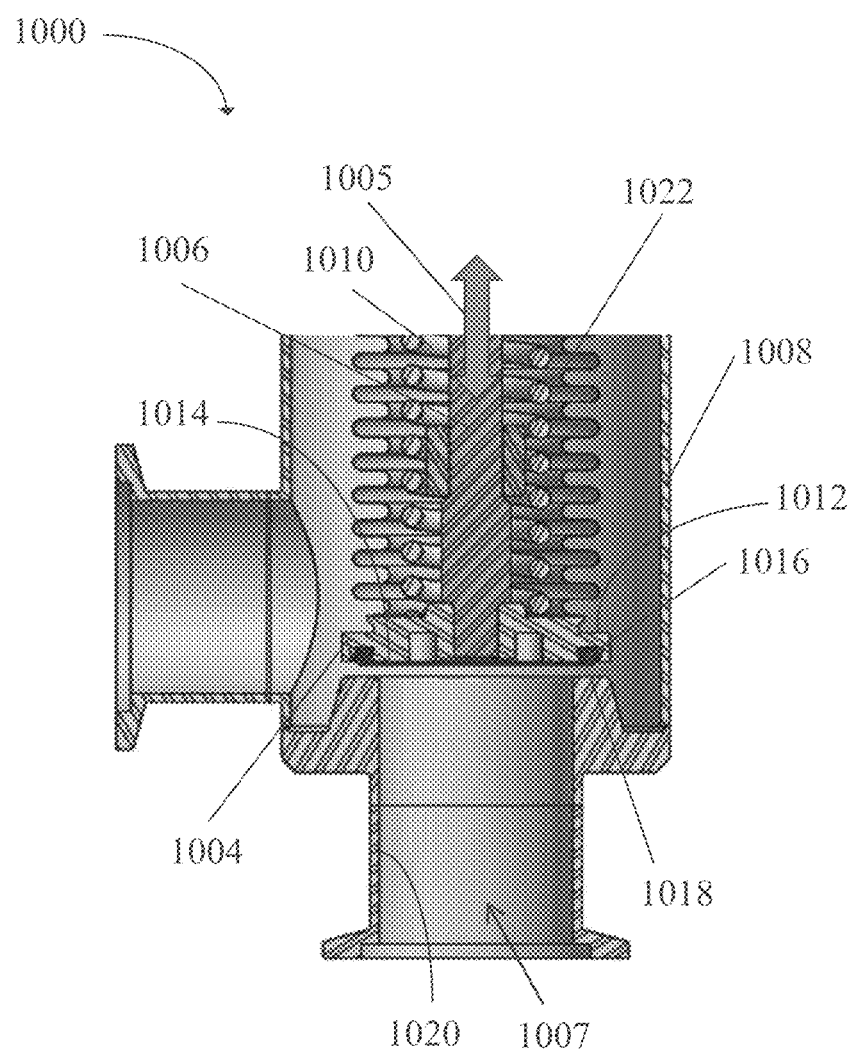
FIG. 10 shows a cross-sectional view of an exemplary isolation valve based on which a valve assembly can be created to provide in-situ, localized processing of the valve.

FIG. 10 shows a cross-sectional view of an exemplary isolation valve 1000 based on which a valve assembly can be created to provide in-situ, localized processing of the valve 1000. The isolation valve 1000 includes a control element 1004 (e.g., a nosepiece) and a shaft 1006 used to move the control element 1004 in a vertical direction 1005 between an open position to expose the opening 1007 and a closed position to block the opening 1007. In addition, the isolation valve 1000 includes a body 1008 through which gas flows when the control element 1004 is in the open position. As shown, the control element 1004 has a proximal surface 1012 and a distal surface 1014, where the proximal surface 1012 has a spring 1010 connected thereto and the distal surface 1014 has one or more o-rings 1016 attached thereto. Extension of the spring 1010 urges the control element 1004 to abut against a seat 1018 of the body 1008 of the valve 1000 such that the o-rings 1016 physically contact the seat 1018 to close the opening 1007. Retraction of the spring 1010 moves the control element 1004 away from the seat 1018 to uncover the opening 1007. The isolation valve 1000 can also include one or more bellows 1022 to isolate vacuum from atmosphere while permitting motion of the control element 1004 in the vertical direction 1005. The conductance of the isolation valve 1000 is a function of the amount of opening defined by the position of the control element 1004 relative to the seat 1018.

At least one surface of the isolation valve 1000, including a surface of the valve body 1008, the control element 1004 or the shaft 1006 can be electrically grounded to form an electrically grounded surface. For example, the electrically grounded surface can be located on the distal surface 1014 of the control element. As another example, the electrically grounded surface can be located on a surface 1020 of the valve body 1008 defining the opening 1007. In some embodiments, a buried electrode assembly (not shown), similar to the buried electrode assembly 301 described above with respect to the throttle valve 302, can be positioned adjacent to the isolation valve 1000 and the electrically grounded surface to generate a plasma discharge between the buried electrode assembly and the electrically grounded surface (e.g., in the opening 1007).

Figure 11:
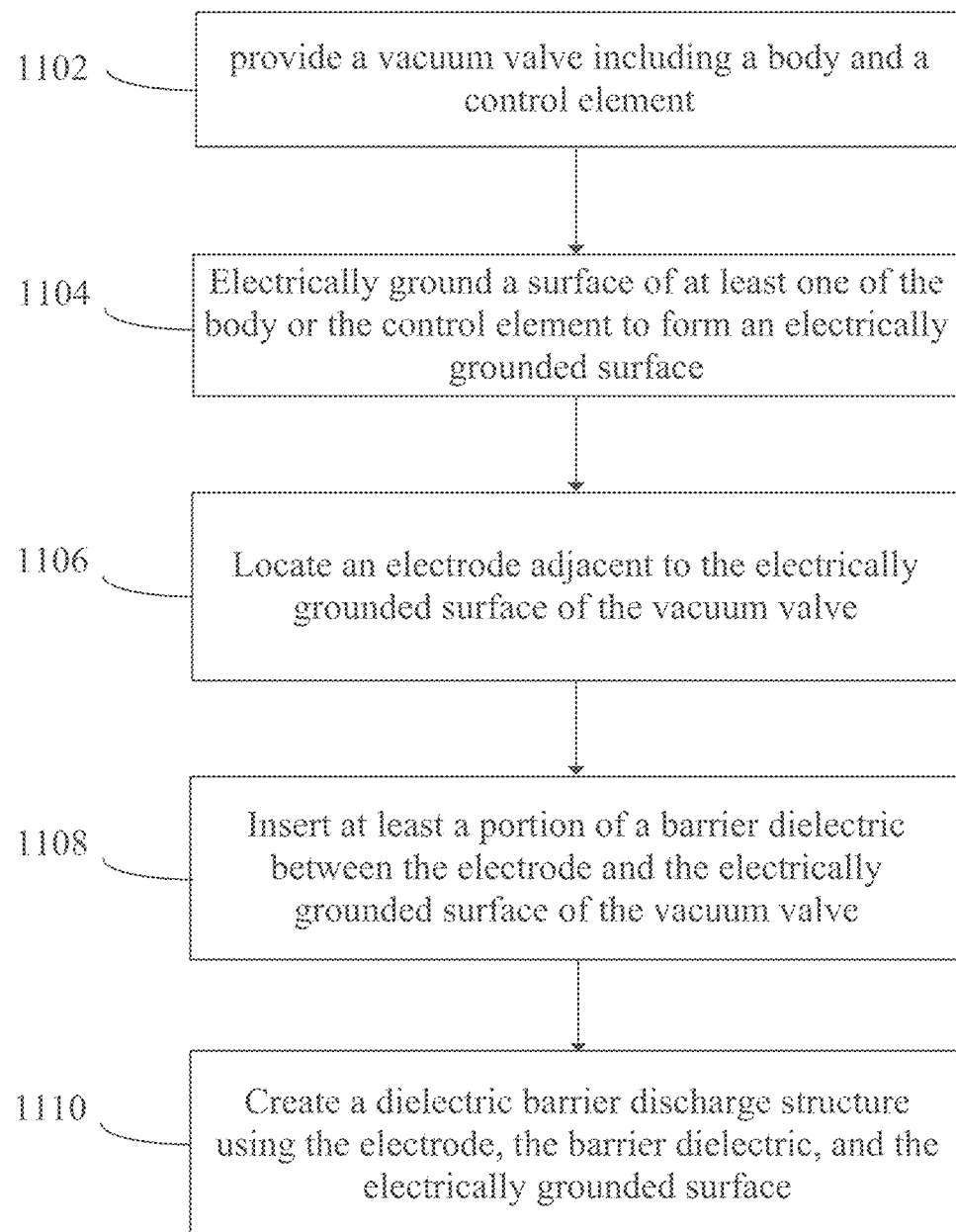
FIG. 11 shows an exemplary process for creating a valve assembly, such as the valve assembly of FIGS. 3-10.

FIG. 11 shows an exemplary process for creating a valve assembly, such as the valve assembly described above with reference to FIGS. 3-10. The process starts when a vacuum valve is provided (step 1102), such as the throttle valve 302, the pendulum valve 900 or the isolation valve 1000. The valve generally includes a body and a control element (e.g., the flapper 304 of the throttle valve 302, the gate 904 of the pendulum valve 900, or the nosepiece 1004 of the isolation valve 1000). A surface of the body or the control element of the valve can be electrically grounded to form an electrically grounded surface (step 1104). To form a buried electrode assembly, an electrode can be located adjacent to the electrically grounded surface of the vacuum valve (step 1106) and at least a portion of a barrier dielectric can be inserted between the electrode and the electrically grounded surface (step 1108). The buried electrode assembly can be arranged such that the electrode is on an interior surface of the barrier dielectric. In some embodiments, an isolator dielectric is also included in the buried electrode assembly, with the electrode placed on an interior surface of the isolator dielectric. That is, the electrode can be sandwiched between the isolator dielectric and the barrier dielectric. A dielectric barrier discharge structure is thereby created based on the buried electrode assembly (including the electrode and the barrier dielectric) and the electrically grounded surface (step 1110). The dielectric barrier discharge structure is adapted to generate a localized plasma coupled to the vacuum valve, such as between the buried electrode assembly and the electrically grounded surface, to process at least a portion of the vacuum valve. A high voltage alternative current can be supplied between the electrode and the electrically grounded surface to activate the dielectric barrier discharge structure to generate the localized plasma. In some embodiments, the power of the resulting plasma is about 15 Watts at about 2 Torr.

Figure 12:
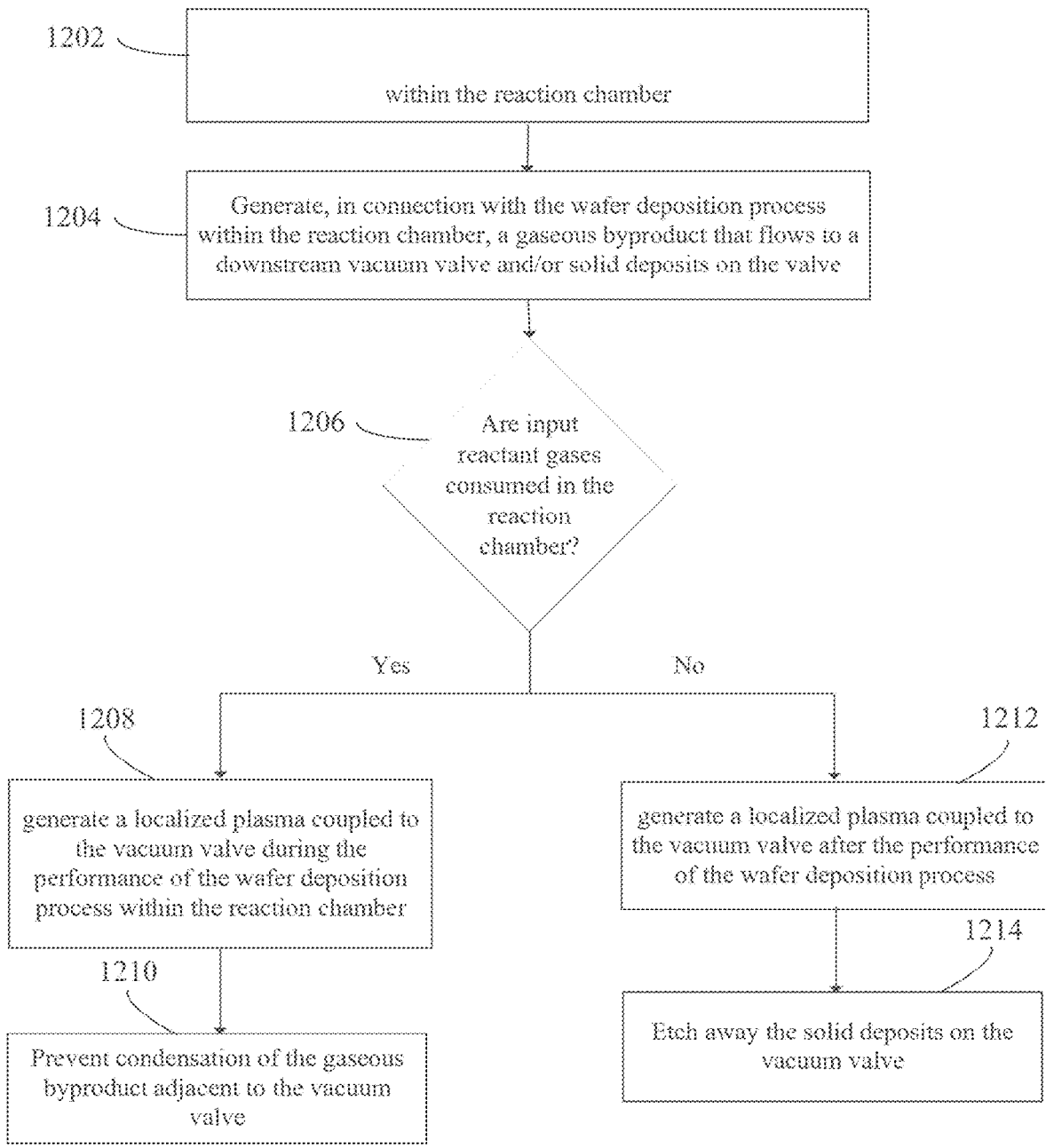
FIG. 12 shows an exemplary process for using a valve assembly of the present invention, which includes a buried electrode assembly and a valve, to clean at least a portion of the valve in one of two modes of operation.

In some embodiments, a valve assembly of the present invention is located downstream from a reaction chamber used to process wafers in a deposition process. As described above, solid and/or vapor byproducts from a deposition process can become unwanted material deposition on a valve that is downstream from the reaction chamber. Therefore, forming a valve assembly about a valve in the foreline enables targeted, in-situ cleaning of the valve. FIG. 12 shows an exemplary process for using a valve assembly of the present invention, which includes at least a buried electrode assembly and a valve, to clean at least a portion of the valve in one of two modes of operation. The process starts with the generation of a primary plasma in the reaction chamber in connection with a wafer deposition process within the chamber (step 1202). As described above, the wafer deposition process can potentially cause unwanted material deposition on the downstream vacuum valve due to the production of gaseous byproducts that can flow downstream to the valve and/or solid materials that can deposit on the valve (step 1204). A determination is made of whether the wafer deposition process in the reaction chamber is a rate limited process (i.e., if some of the input reactant gases are not consumed at the wafer plane) or a reactant limited process (i.e., if most or all of the input reactant gases are consumed at the wafer plane) (step 1206). If a reactant limited process is determined, a prevention mode of operation is executed that takes place substantially during the deposition process in the reaction chamber. Otherwise, the wafer deposition process is a rate limited process and an elimination mode of operation is executed after wafers are removed from the reaction chamber and the chamber is relatively inactive. As described above, a reactant limited reaction tends to produce more chemically stable byproducts than a rate limited reaction. When a plasma is applied to a gaseous byproduct, the resulting heat can also dissociate many of the molecules in the byproduct into their constituent elements. If the original molecules are chemically stable (e.g., from a reactant limited reaction), they are adapted to reform into the same stable modules after plasma heating. However, if the original molecules in a byproduct are not stable (e.g., from a rate limited reaction), the dissociated elements are likely to form into other molecules that can become unwanted deposits on the foreline components. Therefore, for a rate limited reaction, localized plasma is not activated during wafer deposition since localized plasma heating during deposition can produce additional solid deposits. However, for a rate limited reaction, localized plasma can be activated after wafer deposition to clean away the solid deposits with the aid of certain cleaning chemistry.

In the prevention mode of operation, the valve assembly that incorporates the valve to be cleaned can be activated (e.g., by applying a high voltage alternative current) to generate a localized plasma between the electrically grounded surface on the valve and the adjacent buried electrode assembly (step 1208). The localized plasma can be sustained during at least a portion of the wafer deposition process to prevent condensation of gaseous byproducts to solid deposits on the valve (step 1210), where the gaseous byproducts tend to be chemically stable. In some embodiments, the localized plasma is sustained slightly after the completion of the wafer deposition process in the reaction chamber. Hence, the primary plasma in the reaction chamber and the localized plasma in the valve assembly downstream from the reaction chamber can occur about the same time or at least overlap at least a portion of the time in the prevention mode of operation. In the prevention mode, the localized plasma of the valve assembly is used to heat the gaseous byproduct so that it remains in the vapor form even when the temperature in the valve cools due to, for example, the throttling processing if the valve is a throttle valve. Therefore, the prevention mode is adapted to prevent deposition from occurring in the first place due to condensation of gasses caused by their rapid cooling during pressure reduction function inherent in a valve.

Alternatively, in the elimination mode of operation, the valve assembly can be activated to generate a localized plasma after the performance of wafer deposition in the reaction chamber (step 1212). The localized plasma can etch away the solid deposits that have already formed on the valve. Hence, there can be substantially little or no overlap between the generation of the primary plasma in the reaction chamber and the generation of the localized plasma in the valve assembly. In some embodiments of the elimination mode of operation, a cleaning gas, such as a fluorinated or chlorinated gas (i.e. NF3), is supplied to the vacuum valve prior to activation of the localized plasma in the valve assembly. The cleaning gas interacts with the localized plasma to create radicals to etch away the solid deposits on the valve. In some embodiments of both modes of operation, the localized plasma can process not only the valve integrated with the valve assembly, but also adjacent portions of the foreline on which the valve is located.

In some embodiments, a control circuit (not shown) is provided to automate the process of FIG. 12. For example, the control circuit can automatically operate the valve assembly in the prevention mode during every wafer deposition process or during a deposition process after a certain number has already taken place. Similarly, the control circuit can automatically operate the valve assembly in the elimination mode after every wafer deposition or after a certain number of deposition processes. In some embodiments, the control circuit includes a power supply configured to generate a high-voltage AC to activate the localized plasma in a valve assembly. For example, the power supply can be a current-regulated power supply that can provide about 600 V to 1000 V at about 50 kHz. Plasma discharge by the valve assembly is adapted to clamp the voltage and current regulation controls power of the plasma. In some embodiments, multiple valve assemblies can be constructed around multiple valves along a foreline. The control circuit can independently control each valve assembly to clean the respective valve as needed. In some embodiments, the barrier discharge structure of a valve assembly can be similarly used to clean foreline plumbing other than a valve. For example a foreline that normally requires regular maintenance for removal of process deposits can include a surface barrier discharge source for in situ cleaning.

In another aspect of the present invention, systems and methods are provided to reduce and/or eliminate unwanted deposit accumulation in a vacuum pumping line. In some embodiments, one or more pumping line plasma sources are provided for treatment of these unwanted byproducts. These plasma sources can be constructed based on the dielectric barrier discharge principles described above with respect to FIGS. 2a-c. For example, a plasma source of the present invention can include a dielectric barrier discharge structure for generating a localized plasma discharge. The dielectric barrier discharge structure can be formed by (i) a supply electrode, (ii) a return electrode located adjacent to the supply electrode, and (iii) a barrier dielectric material, at least a portion of which is positioned between the supply electrode and the return electrode. A high-voltage alternative current can be supplied between the supply electrode and the return electrode to activate the dielectric barrier discharge structure, thereby generating a plasma localized within the dielectric barrier discharge structure. In some embodiments, the power of the resulting plasma is about 20 Watts to about 1000 Watts. Forced convection or water cooling can be incorporated into the plasma source to achieve higher power intensity in the plasma generated. In addition, the plasma sources of the present invention can form an inline connection with one or more pumping line segments, where each inline plasma source provides a generally cylindrical interior volume that allows a gas from the pumping line to flow therethrough without altering the pumping speed and/or conductance along the pumping line. The plasma of each plasma source can be formed along the surface of the cylindrical interior volume to dissociate the gas flow therein. Generally, due to the low pressure and long mean free path provided by the inline plasma sources, the resulting plasmas are adapted to fill a significant portion of the the entire diameter of the interior volumes.

In the context of the present invention, a supply electrode of a dielectric barrier discharge structure generally refers to an electrode receiving a positive voltage, e.g., about 300 to about 2000 V, from a connected power supply. A return electrode generally refers to an electrode maintained at a lower voltage relative to the supply electrode. For example, the return electrode can be electrically grounded, floating (i.e., not connected to a power source), or biased to a negative voltage with respect to the supply electrode. In some embodiments, the supply electrode and the return electrode of a dielectric barrier discharge structure are both embedded in the barrier dielectric material, with the return electrode either electrically grounded or not grounded (e.g., floating). In some embodiments, the supply electrode is embedded in the barrier dielectric material while the electrically-grounded return electrode is outside of the barrier dielectric material. A buried electrode assembly generally refers to a structure including a barrier dielectric material and having at least one of a return electrode or a supply electrode embedded in the barrier dielectric material.

Figure 13B:
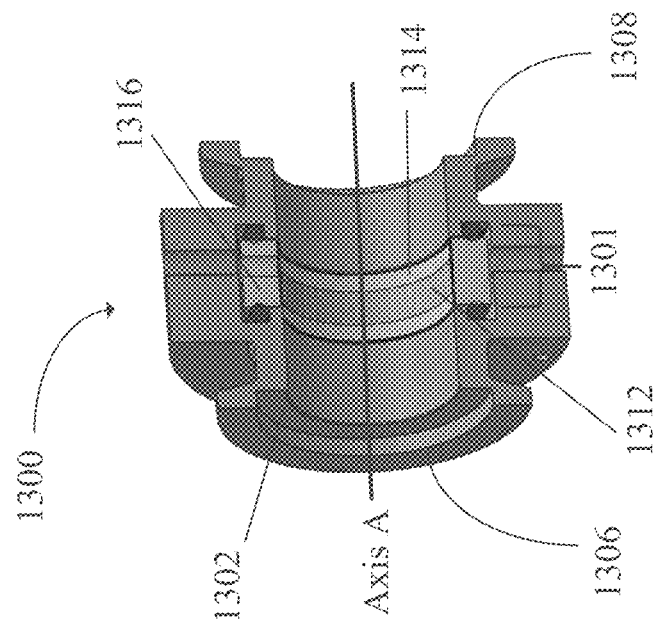
FIGS. 13a and 13b show exterior and sectional views, respectively, of an exemplary plasma source configured to be coupled to a vacuum pumping line.
Figure 13A:
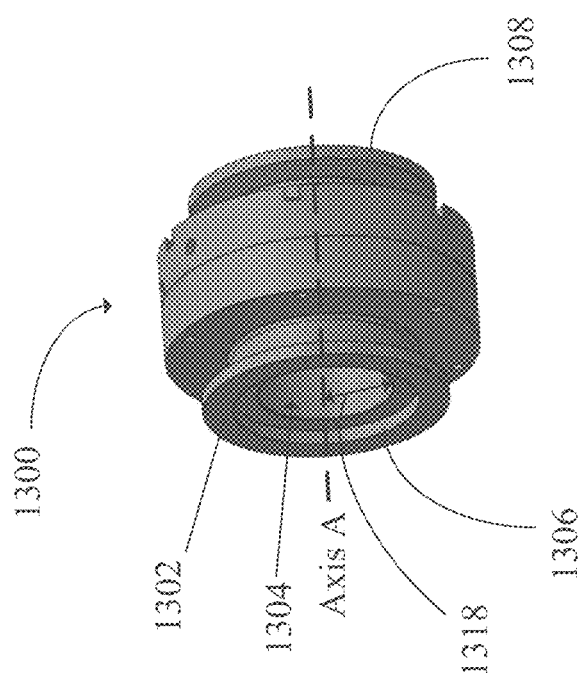

FIGS. 13a and 13b show exterior and sectional views, respectively, of an exemplary plasma source 1300 configured to be coupled to a vacuum pumping line. The plasma source 1300 includes a body 1302 defining a generally cylindrical interior volume 1304 extending along and disposed about a central longitudinal axis A. In some embodiments, at least a portion of the generally cylindrical interior volume 1304 of the plasmas source 1300 is defined by an interior surface of the body 1300 that is disposed about the interior volume 1304. The body 1302 of the plasma source 1300 can be made of a conductive material, e.g., stainless steel or anodized aluminum.

The body 1302 has an input port 1306 at a proximal end along the longitudinal axis A for coupling to an input pumping line segment (not shown) and an output port 1308 at a distal end along the longitudinal axis A for coupling to an output pumping line segment (not shown). Thus, once the plasma source 1300 is connected to the input pumping line segment at the input port 1306 and the output pumping line segment at the output port 1308, the plasma source 1300 becomes a segment of the overall pumping line. Further, the generally cylindrical interior volume 1304 of the plasma source 1300 can be substantially straight along the central longitudinal axis A and coaxial with respect to the interior volumes of the input pumping line segment and the output pumping line segment such that the resulting interior channel of the pumping line is substantially cylindrical with no additional structures in the channel to obstruct the fluid flow therein. In addition, a generally constant pumping speed and/or conductance can be maintained throughout the resulting interior channel of the pumping line regardless of whether the fluid is traveling through the interior volumes of the input/output pumping line segments or the interior volume 1304 of the plasma source 1300.

The plasma source 1300 of FIGS. 13a and 13b can form a dielectric barrier discharge structure that includes (i) a buried electrode assembly 1301 comprising a supply electrode 1312 sandwiched between a barrier dielectric material 1314 and an isolator dielectric material 1316 in the radial direction perpendicular to the longitudinal axis A, and (2) a return electrode outside of the buried electrode assembly 1301. The supply electrode 1312 can thus be embedded in at least one of the barrier dielectric material 1314 or the isolator dielectric material 1316 within the buried electrode assembly 1301. The buried electrode assembly 1301 can be disposed on an interior surface of the plasma source body 1302 about the longitudinally axis A. The supply electrode 1312 of the buried electrode assembly 1301 can be made of a conductive material, e.g., copper. The return electrode of the dielectric barrier discharge structure can comprise the body 1302 of the plasma source 1300, which can be electrically grounded. Thus, in the plasma source 1300, the return electrode comprises the electrically grounded plasma source body 1302 that is located outside of the buried electrode assembly 1301. The barrier dielectric material 1314 and/or the isolation dielectric material 1316 can substantially surround the supply electrode 1312 in the buried electrode assembly 1301 to electrically and physically isolate the supply electrode 1312 from the adjacent return electrode (i.e., the plasma source body 1306) and the interior volume 1304. In some embodiments, the buried electrode assembly 1301 is substantially the same as the buried electrode assembly 301 described above with respect to FIG. 5, where the supply electrode 1312 is substantially the same as the electrode 312, the barrier dielectric material 1314 is substantially the same as the barrier dielectric 314, and the isolation dielectric material 1316 is substantially the same as the isolator dielectric 316.

As shown, the buried electrode assembly 1301 and the plasma source body 1302 substantially define the interior volume 1304 of the plasma source 1300. For example, the barrier dielectric material 1314 can define at least a portion of the wall of the interior volume 1304 and is exposed to the process gasses. Thus, the barrier dielectric 1304 prevents exposure of the supply electrode 1312 from the process gasses. Due to the the generally cylindrical shape of the plasma source body 1302 and the buried electrode assembly 1301, each of their corresponding interior surfaces can maintain about the same radial distance 1318 to the central longitudinal axis A.

In operation, upon activation of the dielectric barrier discharge structure in the plasma source 1300, a plasma discharge is formed along the surface of the interior volume 1304. Specifically, the plasma discharge can be created between the supply electrode 1312 and the return electrode (i.e., the plasma source body 1302) and maintain a generally toroidal shape about the longitudinal axis A. In some embodiments, the plasma discharge can have a power of about 20 Watts to about 1000 Watts. Due to the low pressure and long mean free path provided by the plasma source 1300, the plasma is adapted to fill a significant portion of the diameter of the interior volume 1304.

Figure 14:
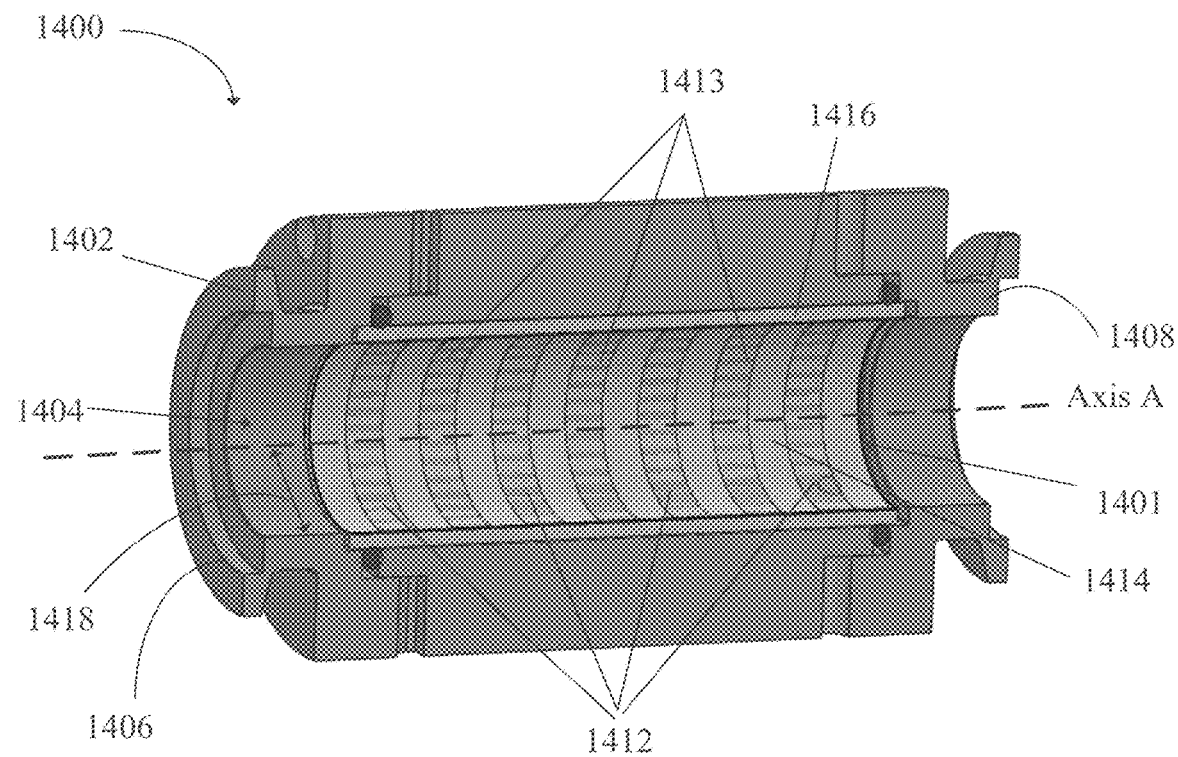
FIG. 14 shows a sectional view of another exemplary plasma source configured to be coupled to a vacuum pumping line.

FIG. 14 shows a sectional view of another exemplary plasma source 1400 configured to be coupled to a vacuum pumping line. The plasma source 1400 can include a conductive body 1402 defining a generally cylindrical interior volume 1404 extending along and disposed about a central longitudinal axis A. Similar to the plasma source 1300, the body 1402 has an input port 1406 at a proximal end along the longitudinal axis A for coupling to an input pumping line segment (not shown) and an output port 1408 at a distal end along the longitudinal axis A for coupling to an output pumping line segment (not shown). The generally cylindrical interior volume 1404 of the plasma source 1400 can be substantially straight along the central longitudinal axis A and coaxial with respect to the interior volumes of the input pumping line segment and the output pumping line segment such that the these pumping line segments maintain about a constant pumping speed and/or conductance.

The plasma source 1400 also forms a dielectric barrier discharge structure defined by a buried electrode assembly 1401 that is disposed on an interior surface of the plasma source body 1402 about the longitudinally axis A. The buried electrode assembly 1401 includes one or more supply electrodes 1412 interspersed among one or more return electrodes 1413, where the supply electrodes 1412 and the return electrode 1413 are disposed between a shared barrier dielectric material 1414 and a shared isolator dielectric material 1416 in the radial direction. In some embodiments, the supply electrodes 1412 and the return electrodes 1413 are embedded in at least one of the barrier dielectric material 1414 or the isolator dielectric material 1416. In some embodiments, the buried electrode assembly 1401 is similarly configured as the buried electrode assembly 606 of FIG. 6d. The supply and return electrodes 1412, 1413 can be disposed in an alternative arrangement along the longitudinal axis A such that each supply electrode 1412 is adjacent to a return electrode 1413 along the longitudinal axis A. Hence, unlike the buried electrode assembly 1301 of the plasma source structure 1300, the buried electrode assembly 1401 includes both the supply and return electrodes 1412, 1413. The return electrodes 1412 can be either electrically grounded or floating with respect to the ground. The plasma source body 1402 can be electrically grounded. In the case where the return electrodes 1412 are left floating, plasma can be formed between the electrodes in the buried electrode assembly 1401, but may not be formed relative to the grounded body 1402. In the case where the return electrodes 1412 are grounded, plasma can be formed between the electrodes in the buried electrode assembly 1401 and between the grounded body 1402 and the closest electrodes in the buried electrode assembly 1401. The barrier dielectric material 1414 and/or the isolator dielectric material 1416 can substantially surround each of the supply electrodes 1412 and the return electrodes 1413 to electrically and physically isolate them from one another, from the surrounding plasma source body 1402, and from the interior volume 1404.

The buried electrode assembly 1401 and the plasma source body 1402 can substantially define the interior volume 1404 of the plasma source 1400 within which process gasses flow. For example, the barrier dielectric 1414 can define at least a portion of the wall of the interior volume 1404 and is exposed to the process gasses. Thus, the barrier dielectric 1414 can prevent exposure of the electrodes 1412 and 1413 from the process gasses. Due to the the generally cylindrical shape of the buried electrode assembly 1401 and the plasma source body 1402, each of their corresponding interior surfaces can maintain about the same radial distance 1418 to the central longitudinal axis A. Further, the supply electrodes 1412 and the return electrodes 1413 can maintain about the same radial distance to the central longitudinal axis A.

One of the advantages of the plasma source 1400 of FIG. 14 in comparison to the plasma source 1300 of FIGS. 13a and *b* is that, due to the increase in the number of supply and return electrodes 1412, 1413 in the buried electrode assembly 1401, the resulting plasma along the axis of gas flow (i.e., along the longitudinal axis A) is enlarged in comparison to the plasma generated by the plasma source 1300. This in turn increases the residence time of a cleaning gas in the plasma, which increases the dissociation efficiency at higher mass flow rates, or gas velocities, meaning that more unwanted byproducts can be etched away by the dissociated molecules in the cleaning gas.

Figure 15:
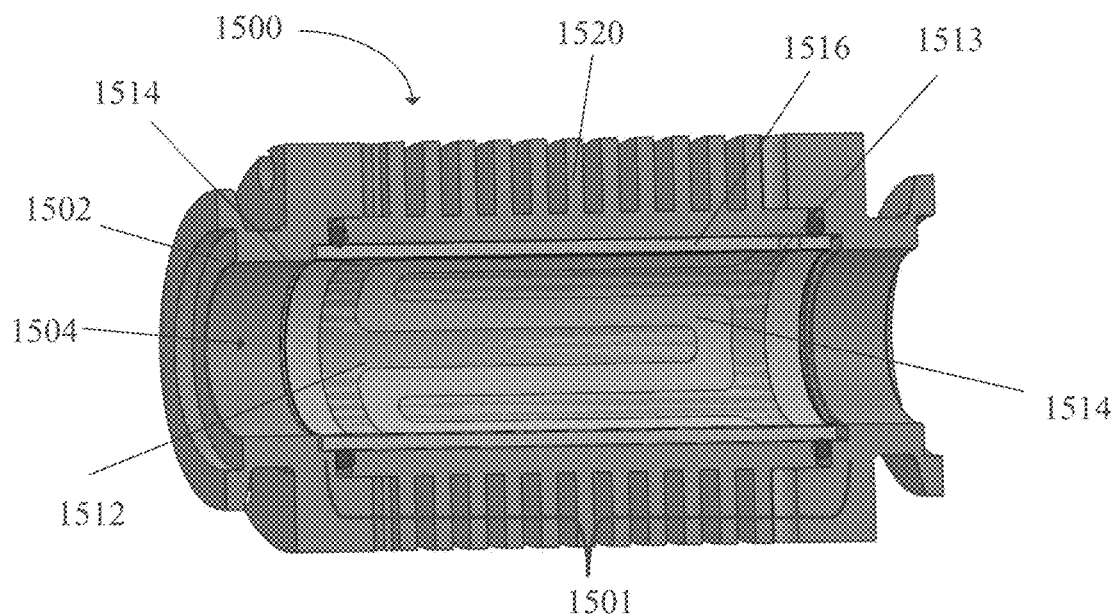
FIG. 15 shows a sectional view of yet another exemplary plasma source configured to be coupled to a vacuum pumping line.

FIG. 15 shows a sectional view of yet another exemplary plasma source 1500 configured to be coupled to a vacuum pumping line. The plasma source 1500 forms a dielectric barrier discharge structure defined by a buried electrode assembly 1501, which includes at least one supply electrode 1512 and at least one return electrode 1513, each of which is disposed between a shared barrier dielectric material 1514 and a shared isolator dielectric material 1516 in the radial direction. The plasma source 1500 is substantially similar to the plasma source 1400 of FIG. 14. One difference between the two plasma sources 1400, 1500 is the arrangement of the supply electrode and the return electrode within the buried electrode assembly 1501. As shown in FIG. 15, the "T"-shaped supply electrode 1512 can be partially surrounded by the "U"-shaped return electrode 1513 with at least a portion of the isolator dielectric material 1516 and at least a portion of the barrier dielectric material 1514 sandwiched between the two electrodes to physically separate them from one another. In addition, the barrier and isolator dielectric materials 1514, 1516 can physically and electrically separate the electrodes 1512, 1513 from the nearby plasma source body 1502 and the interior volume 1505.

In some embodiments, the plasma source 1500 includes one or more cooling mechanisms for reducing a temperature of the plasma source 1500 when it is activated, thereby allowing higher power intensity plasma to be generated in the plasma source 1500. As shown, fins 1520 can be disposed on an exterior surface of the plasma source body 1502 to provide heat dissipation through forced convection cooling by air. The fins can be constructed from a heat-conducting material, e.g., aluminum. In some embodiments, the fins 1520 are sufficiently sized to maintain the plasma source 1500 at a temperature of less than about 100 Celsius while a plasma is being generated.

Figure 16:
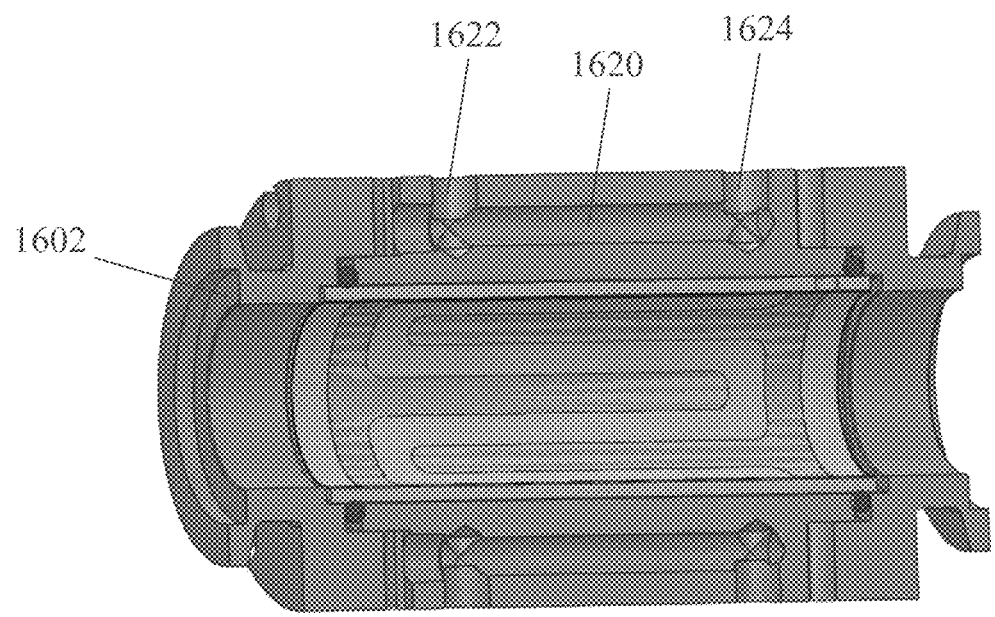
FIG. 16 shows a sectional view of yet another exemplary plasma source configured to be coupled to a vacuum pumping line.

FIG. 16 shows a sectional view of yet another exemplary plasma source 1600 configured to be coupled to a vacuum pumping line. The plasma source 1600 is substantially similar to the plasma source 1500 of FIG. 15. One difference between the two plasma sources 1500, 1600 is the cooling mechanism employed. As shown, at least one cooling channel 1620 can be disposed in the body 1602 of the plasma source 1600, e.g., extending longitudinally along the body 1602. The cooling channel 1620 can be configured to receive a cooling liquid (e.g., water) from an inlet 1622, conduct the liquid along the length of the plasma body 1602 to remove heat during a plasma-generation process, and conduct the liquid away from the body 1602 via an outlet 1624. In some embodiments, multiple cooling channels 1620 can be disposed in different sections of the plasma source body 1602 to maximize cooling.

The plasma source configurations described above with reference to FIGS. 13-16 are merely illustrative. Variations in form and detail may be made without departing from the spirit and scope of the present invention. In one example, the components that are designated supply electrode(s) and return electrode(s) in the plasma sources 1300, 1400, 1500, 1600 can reverse in polarity so that the supply electrodes can function as the return electrodes and vice versa while still preserving substantially the same plasma generation capability. In another example, the air cooling mechanism and/or the liquid cool mechanism described above with respect to plasma sources 1500, 1600 can also be constructed in any one of the plasma sources 1300 and 1400 to achieve similar cooling functions.

In general, the dielectric barrier discharge structures of the plasma sources 1300, 1400, 1500, 1600 operate according to the plasma discharge principles described above with respect to FIGS. 2a-c. Hence, changes can be made to these dielectric barrier discharge structures to implement the different plasma-generating configurations described in FIGS. 2a-c without departing from the spirit and scope of the present invention. For example, while not described in detail, a dielectric isolator can be incorporated in the buried electrode assemblies of the plasma sources 1300, 1400, 1500, 1600 to achieve the desire plasma discharge function. In some embodiments, at least one of the buried electrode assemblies of the plasma sources 1300, 1400, 1500, 1600 is formed as a co-fired ceramic structure. For example, the barrier dielectric material and/or the dielectric isolator material can be ceramic and formed in a "green state" (e.g., at room temperature). Then, at least one high-temperature metal element with similar coefficient of thermal expansion as the ceramic material(s) of the barrier dielectric and/or the dielectric isolator can be patterned onto the ceramic material (s). The high-temperature metal can serve as the supply electrode of the buried electrode assembly. The resulting structure is pressed and co-fired at high temperature, e.g., about 1550 Celsius to about 1700 Celsius, to form a unitary structure.

In some embodiments, one or more of the plasma sources 1300, 1400, 1500, 1600 can include features that allow introduction of a secondary fluid (e.g., a secondary gas) into the plasma source in addition to the primary fluid received from the input port (e.g., input port 1306) of the plasma source. At least one of the primary fluid or the secondary fluid can be a cleaning gas, e.g., a fluorinated or chlorinated gas (i.e. $NF_3$, $CF_4$, $NF_3$ combined with $O_2$, $SF_6$, etc.). In some embodiments, both the primary and secondary fluids are the same cleaning gas. In other embodiments, they are different gases. Each cleaning gas can interact with the localized plasma of a plasma source to create radicals that can etch away solid deposits in the pumping line.

Figure 17:
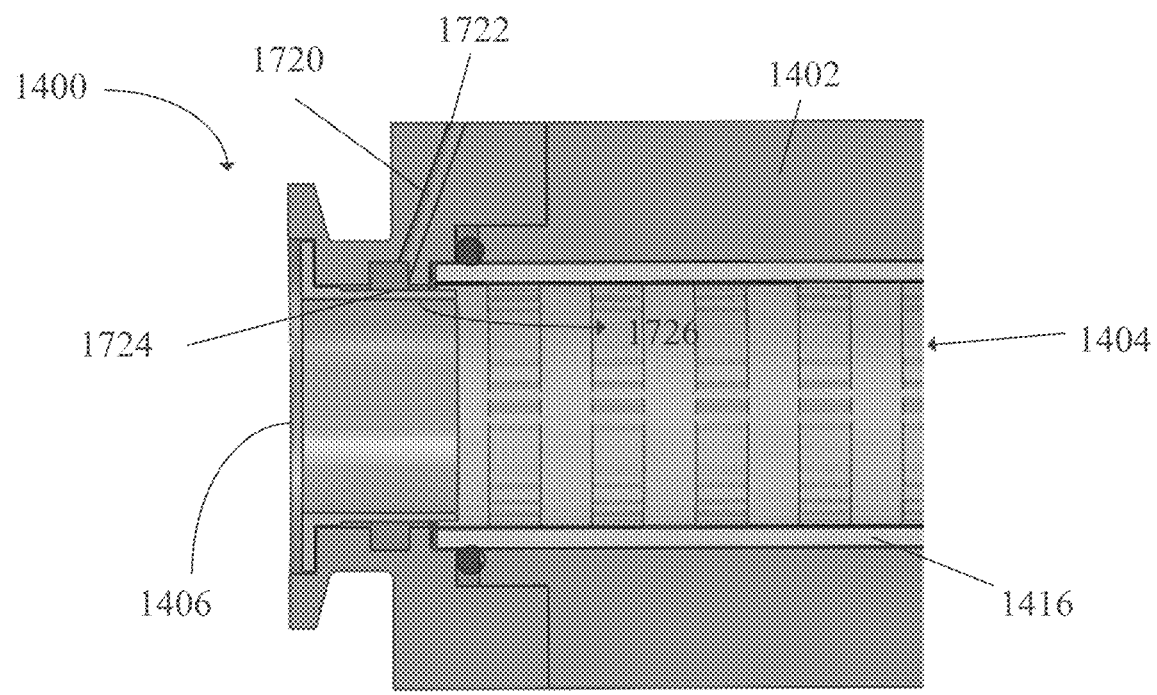
FIG. 17 shows an exemplary section of the plasma source of FIG. 14 incorporating an auxiliary port for receiving a secondary fluid.

FIG. 17 shows an exemplary section of the plasma source 1400 of FIG. 14 incorporating an auxiliary port 1720 for receiving a secondary fluid, e.g., a cleaning gas. The secondary fluid can supplement the primary fluid received by the plasma source 1400 via the input port 1406, where the primary fluid can be another cleaning gas that may or may not be the same as the secondary fluid. Specifically, the plasma source 1400 includes the input port 1406 that can be connected to an input pumping line segment (not shown) that is in fluid communication with a processing chamber (not shown). The processing chamber can be positioned upstream relative to the plasma source 1400 such that a primary cleaning gas from the processing chamber can be pumped through the pumping line. The plasma source 1400 can receive the primary cleaning gas from the processing chamber via the input port 1406 and activate a localized plasma to interact with the primary cleaning gas, thereby creating radicals adapted to etch away deposits in the pumping line. Details regarding this treatment process are described below.

In addition, the plasma source 1400 can directly receive a secondary cleaning gas via the auxiliary port 1720, which can be an annular nozzle. As shown, the body 1402 of the plasma source 1400 includes the auxiliary port 1720 having an inlet 1722 exposed to an exterior surface of the body 1402. The inlet 1722 of the auxiliary port 1720 can be connected to a source of the secondary cleaning gas (not shown) for injection into the plasma source 1400. In some embodiments, a controller (not shown) can be positioned between the source of the secondary cleaning gas and the inlet 1722 of the auxiliary port 1720 to feed, pump, or otherwise introduce the secondary cleaning gas to the plasma source 1400 and to control, monitor or regulate the amount of gas introduced. In some embodiments, the auxiliary port 1720 is substantially embedded in the body 1402 of the plasma source 1400 and spaced from the input port 1406 and the output port 1408. The auxiliary port 1720 can have an outlet 1724 exposed to and in fluid communication with the generally cylindrical interior volume 1404 of the plasma source 1400 such that it can introduce the secondary cleaning gas, received from the inlet 1722, to the interior volume 1404. The auxiliary port 1720 can be embedded in the body 1402 of the plasma source 1400 close to the input port 1406 and upstream from the buried electrode assembly 1401 without contacting the buried electrode assembly 1401.

Once in the interior volume 1404, the secondary gas can flow in a downstream direction 1726 away from the processing chamber. For example, the plasma source 1400 can be configured in a manner to allow the secondary cleaning gas to flow in an annular flow pattern close to the wall of the interior volume 1404 in the downstream direction 1726. In implementations with a larger bore diameter of the annular nozzle at the auxiliary port 1720, the plasma size is limited by the mean free path of the molecules. Therefore, the resulting plasma is likely to form close to the wall of the interior volume 1404. Injecting the cleaning gas close to the wall of the interior volume 1404 increases the probability of dissociating the cleaning gas by increasing the residence time of the cleaning gas in the plasma.

Figure 18:
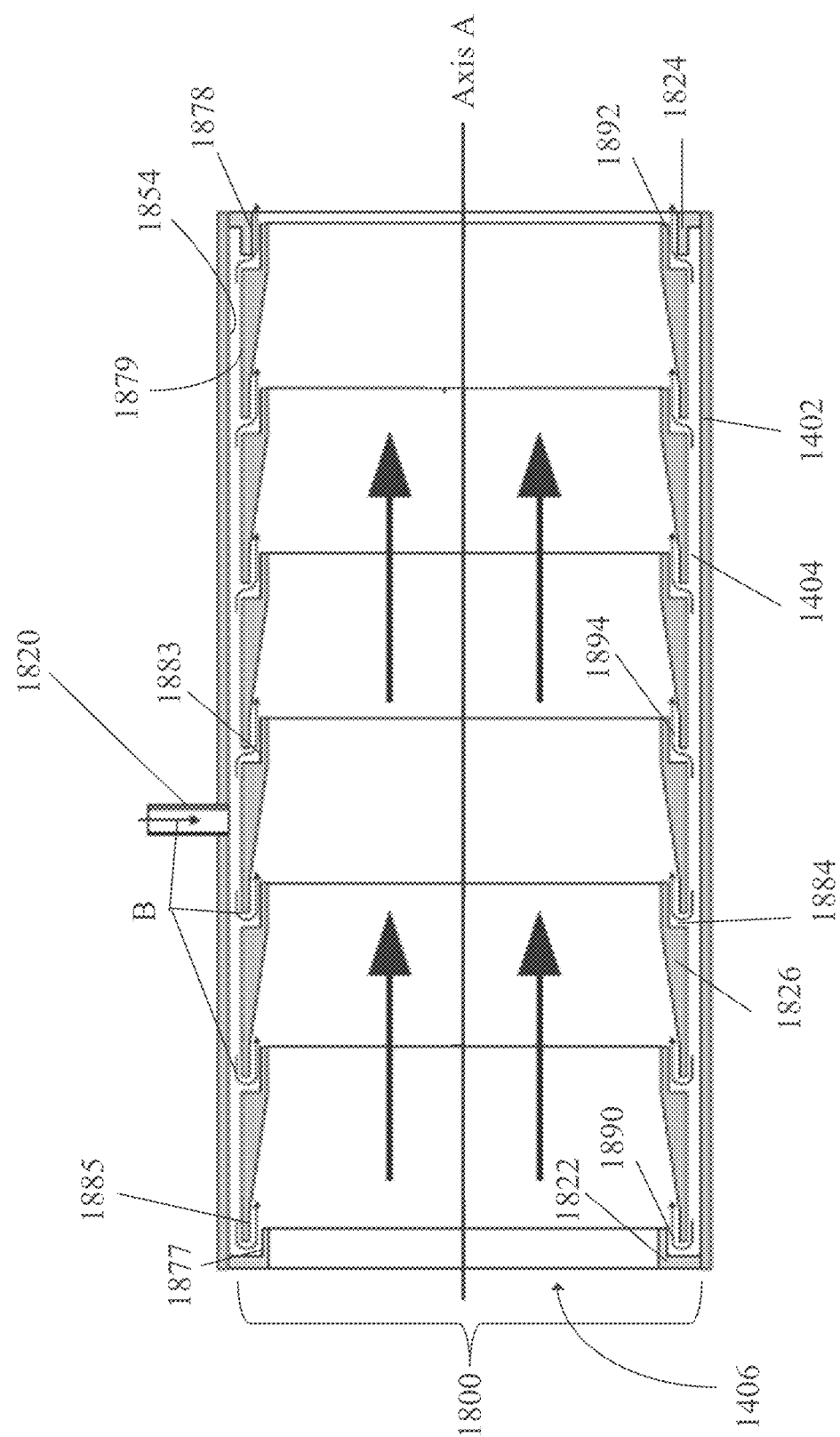
FIG. 18 shows an exemplary design of a nozzle assembly configured to create a boundary layer or moving wall of secondary fluid for introduction to at least a section of an interior volume of a plasma source.

Generally, to promote the dissociation of the cleaning gas, the gas can be injected or otherwise introduced into the interior volume 1404 in a manner that directs the gas flow along the wall of the interior volume 1404 to increase the residence time in the plasma. FIG. 18 shows an exemplary design of a nozzle assembly 1800 configured to create a boundary layer or moving wall of secondary fluid for introduction to at least a section of an interior volume of a plasma source, e.g., to the interior volume 1404 of the plasma source 1400. The geometry of the nozzle assembly 1800 of FIG. 18 allows the secondary fluid to be injected into the interior volume 1404 in a series of angled gaps (e.g., nozzles) 1890, 1892, 1894, where each gap segment can include a barrier discharge section (e.g., a section of the interior volume 1404 within which a plasma is formed). The nozzle assembly 1800 has a generally hollow cylindrical or tubular shape and includes (i) an upstream collar section 1822, (ii) a downstream spacer ring or section 1824, and (iii) one or more modular middle sections 1826, configured as annular rings for example, positioned between and connected to the upstream collar 1822 and the downstream spacer ring 1824. The nozzle assembly 1800 can be arranged in a stacked configuration and located in one or more sections of a pumping line where byproducts are particularly prone to deposition. In the embodiment illustrated in FIG. 18, at least a portion of the nozzle assembly 1800 is positioned in a section of the generally cylindrical interior volume 1404 of the plasma source 1400 such that the nozzle assembly 1800 is surrounded externally by the plasma source body 1402. For example, the nozzle assembly 1800 can be integrated with the buried electrode assembly 1401 or positioned upstream from the buried electrode assembly 1401. In other embodiments, at least a portion of the nozzle assembly 1800 is positioned within a hollow cylindrical volume of an input pumping line segment that is connected to the input port 1406 of plasma source 1400. In yet other embodiments, the nozzle assembly 1800 is positioned in the junction where the input pumping line segment meets the plasma source 1400, with a portion of the nozzle assembly 1800 disposed within the interior volume of the input pumping line segment and the remaining portion of the nozzle assembly 1800 disposed within the interior volume 1404 of the plasma source 1400.

An auxiliary port 1820, similar to the auxiliary port 1720 of FIG. 17, can be disposed in the body 1402 of the plasma source 1400 to introduce a flow of a secondary gas into the interior volume 1404. A gap can be maintained between the inner surface 1854 of the plasma source body 1402 and the outer surface 1879 of each middle section 1826 to enable a sufficient volume to be formed so as to allow the secondary gas injected from the auxiliary port 1820 to flow through multiple slots 1884 defined by the middle sections 1826. Particularly, the secondary gas flows so as to substantially or completely fill the volume between the the inner surface 1854 of the plasma source body 1402 and the outer surfaces 1879 of the middle sections 1826 of the nozzle assembly 1800 as indicated by the arrows B. In some embodiments, one or more o-ring seals (not shown) can be used to prevent the gas from flowing upstream and channel substantially all of the gas flow through the slots 1884. In some embodiments, the multiple middle sections 1826 are stacked and/or staggered along the longitudinal direction A such that each slot 1884 of the middle sections 1826 is positioned adjacent to either the smooth portion 1877 of the upstream collar 1822 (pertains to the middle section 1826 that is closest to the collar 1822) or the smooth section 1883 of another middle section 1826 (pertains to the remaining middle sections 1826). Hence, a gap 1890 can be formed between the inner surface 1885 of the middle section 1826 that is closest to the collar 1822 and the smooth portion 1877 of the upstream collar 1822. In addition, a gap 1892 can be formed between the smooth surface portion 1883 of the middle section 1826 that is closest to the downstream spacer 1822 and an inner surface 1878 of the spacer 1824. Further, multiple gaps 1894 can be formed between the inner surface 1885 of one middle section 1826 with the smooth surface 1883 of another middle section 1826.

The gas injected into the plasma source 1400 via the auxiliary port 1820 is adapted to disperse so as to flow substantially through the slots 1884 and the gaps 1890, 1892, 1894 into the interior volume 1404 in a downstream direction. However, the gas does not flow radially inward toward the longitudinal axis A. Rather, the flow of the gas is redirected or deflected by the smooth portions 1877, 1883 such that the gas covers or coats, and flows annularly along, the inner surfaces 1885 of the middle sections 1826 and the inner surface 1878 of the downstream spacer ring 1824. More specifically, the gas forms a boundary layer or moving wall covering at least a substantial portion of the inner surfaces 1885, 1878 of the annular nozzle assembly 1820 and flowing in a generally axial and downstream direction (from the processing chamber) on or along the inner surfaces 1885, 1878 of the annular nozzle assembly 1820 in an annular flow pattern. In some embodiments, the nozzle assembly 1820 is substantially similar to the nozzle assembly of U.S. Pat. No. 5,827,370 or the annular nozzles of U.S. Pat. No. 9,314,824, which are incorporate by reference herein in their entireties.

In some embodiments, the nozzle assembly 1800 is electrically conductive to provide a means of electrical contact for power transmission when the nozzle assembly 1800 is disposed within a section of a pumping line. Thus, at least one of the upstream collar section 1822, the downstream spacer ring or section 1824, or the one or more modular middle sections 1826 is constructed from an electrically conductive material. Even though the auxiliary port 1720 of FIG. 17 and the nozzle assembly 1800 of FIG. 18 are described in the context of the plasma source 1400, in other embodiments, any one of the plasma sources 1300, 1500, 1600 can incorporate the same or similar auxiliary port 1720 for receiving a secondary cleaning fluid and/or the nozzle assembly 1800 for imparting a particular flow pattern to the secondary cleaning fluid.

Figure 19:
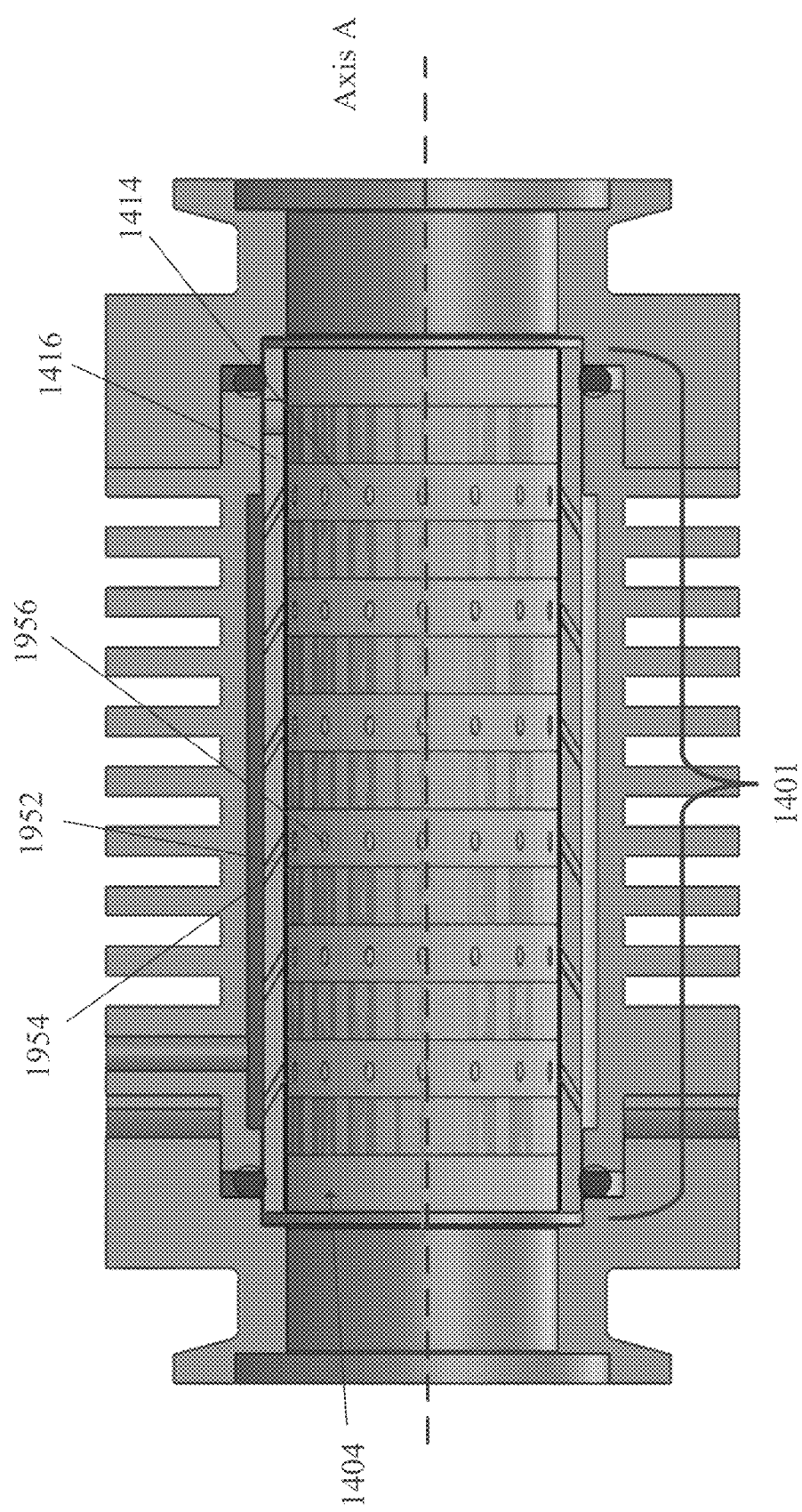
FIG. 19 shows an exemplary design configured to create a distributed secondary fluid flow in an interior volume of a plasma source.

FIG. 19 shows an exemplary design configured to create a distributed secondary fluid flow in an interior volume of a plasma source, e.g., in the interior volume 1404 of the plasma source 1400. As shown, a series of injection ports 1952 are formed in the buried electrode assembly 1401 for introducing a cleaning gas into the interior volume 1404 in a distributed manner. In some embodiments, each injection port 1952 is embedded in portions of the isolator dielectric material 1416 and/or the barrier dielectric material 1414 of the buried electrode assembly 1401 without contacting the electrodes 1412, 1413. For example, the injection ports 1952 can be spaced axially along the central longitudinal axis A as well as radially about the interior volume 1404 within the barrier dielectric material 1414 and the isolator dielectric material 1416. Each injection port 1952 includes an inlet 1954 that fluidly connect an exterior surface of the plasma source 1400 to an outlet 1956 on the wall of the interior volume 1404. Further, each injection port 1952 can be angled such that the cleaning gas coats the wall of the interior volume 1404 after exiting the ports 1952. In some embodiments, the cleaning gas flows radially inward toward the longitudinal axis A after exiting the injection ports 1952. Even though the injection ports 1952 of FIG. 19 are described in the context of the plasma source 1400, in other embodiments, any one of the plasma sources 1300, 1500, 1600 can incorporate the same or similar design for imparting a distributed flow pattern to the secondary cleaning fluid.

Figure 20:
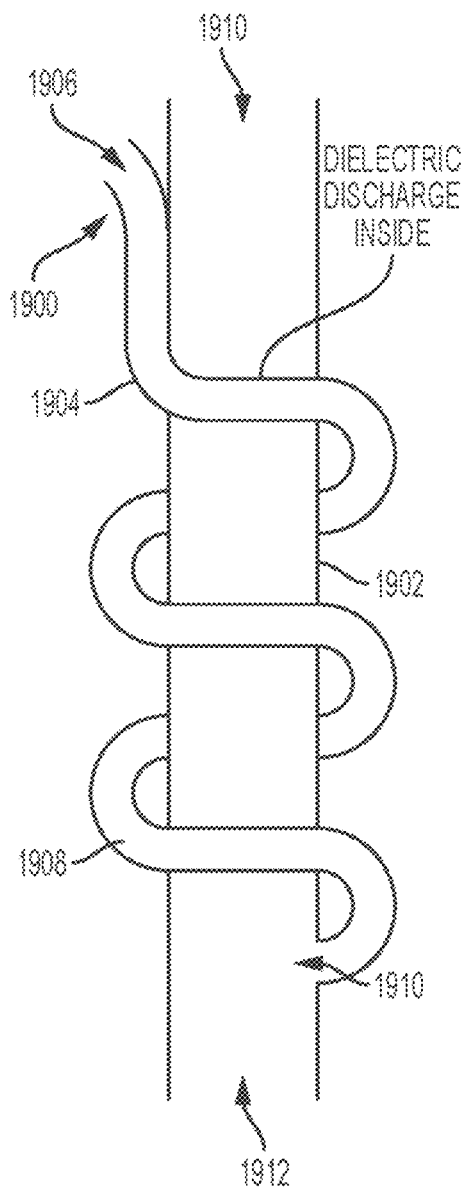
FIG. 20 shows a sectional view of yet another exemplary plasma source configured to be coupled to a vacuum pumping line.

FIG. 20 shows a sectional view of yet another exemplary plasma source 1900 configured to be coupled to a vacuum pumping line 1902. In some embodiments, the pumping line 1902 is connected upstream to a processing chamber (not shown) for receiving a flow of gas exhausted from the processing chamber via an input 1910 of the pumping line 1902. The exhaust gas flow can be pumped away from the processing chamber via the pumping line 1902 by a pump (not shown) connected downstream to the pumping line 1902 at an output port 1912 of the pumping line 1902.

As shown, the plasma source 1900 comprises a helical body 1904 in the shape of a coiled tube that is configured to wrap around the exterior of at least a section of the pumping line 1902. The helical body 1904 includes an input port 1906 for receiving a source of cleaning gas, e.g., a fluorinated or chlorinated gas (i.e. $NF_3$, $CF_4$, $NF_3$ combined with $O_2$, $SF_6$, etc.). As the cleaning gas travels downstream through an interior volume 1908 of the plasma source body 1904, an activated plasma within the body 1904 is adapted to ionize and dissociate the cleaning gas therein. The plasma source body 1904 also includes an output port 1910 in fluid communication with the pumping line 1902 for injecting the ionized and dissociated gas from the interior volume 1908 of the plasma source 1900 to the interior of the pumping line 1902 for etching away byproducts deposited on the pumping line 1902, which can be introduced by the exhaust flow from the processing chamber. In some embodiments, the plasma within the plasma source 1900 can be generated by a dielectric barrier discharge structure (not shown) with at least a portion of which embedded in the plasma source body 1904. For example, the dielectric barrier discharge structure can be similar to any one of the dielectric barrier discharge structures described above with respect to the plasma sources 1300, 1400, 1500, 1600. The dielectric barrier discharge structure can be substantially integrated with the plasma source body 1904 such that it does not interfere with and/or obstruct the gas flow through the tubular interior volume 1908. In some embodiments, the plasma within the plasma source is generated inductively by deploying ferrites (not shown) adjacent to the tubular body 1904. Generally, the plasma source 1900 can have any reasonable longitudinal length to provide a sufficiently long residence time for achieving a high percentage (e.g., close to 100%) of ionization and dissociation of the cleaning gas within the interior volume 1908.

Figure 21:
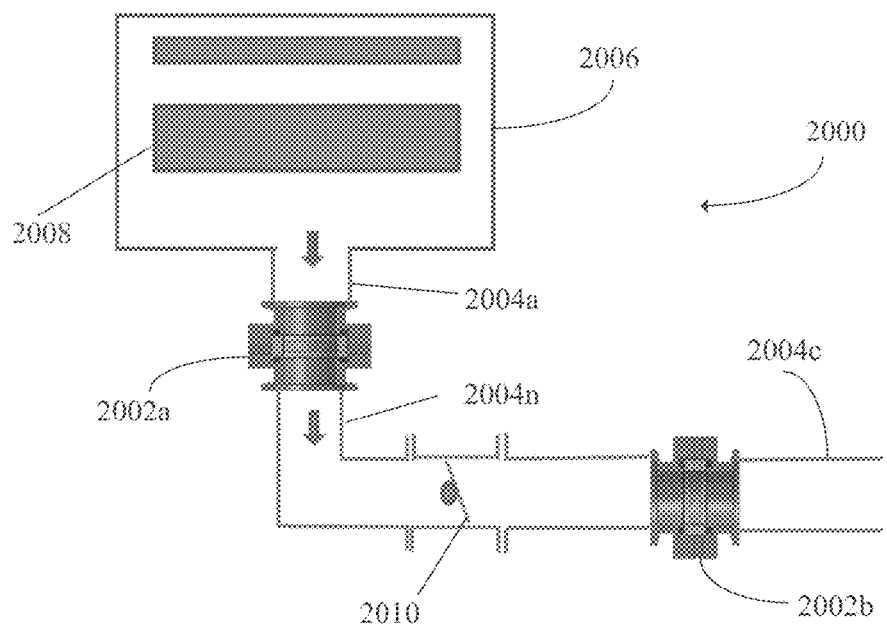
FIG. 21 shows an exemplary plasma cleaning assembly including one or more plasma sources of the present invention for cleaning at least a section of a pumping line of the assembly.

FIG. 21 shows an exemplary plasma cleaning assembly 2000 including one or more plasma sources of the present invention for cleaning at least a section of a pumping line 2004 of the assembly 2000. As shown, the plasma cleaning assembly 2000 includes a processing chamber 2006 for processing a wafer 2008 within the chamber 2006 using, for example, a chemical vapor deposition (CVD) process. During deposition, a portion of the deposition gases is deposited either on the wafer 2008 or the walls of the chamber 2006. The remaining unconsumed gas modules are pumped out of the processing chamber 2006 along with partially reacted compounds and reaction byproducts through the vacuum pumping line 2004 that is in fluid communication with the chamber 2006. Many of the compounds in this exhausted gas flow are still in highly reactive states and/or contain residues or particulate matter that can form unwanted deposits in the pumping line 2004. To reduce or eliminate the unwanted deposits in the pumping line 2004, one or more plasma sources 2002, such as the plasma sources described above with reference to FIGS. 13-19, can be positioned downstream from the processing chamber 2006 and coupled in-line with the pumping line 2004. Each plasma source 2002 can be connected to or replace a portion of the pumping line 2004.

As shown, the plasma source 2002a is fitted between a pumping line segment 2004a at its input port and an pumping line segment 2004b at its output port such that the plasma source 2002a forms a section of the pumping line 2004. Similarly, the plasma source 2002b is connected between the pumping line segment 2004b at its input port and a pumping line segment 2004c at its output port such that the plasma source 2002b forms another section of the pumping line 2004. Such positioning allows the exhausted gases from the plasma chamber 2006 to necessarily pass through the interior volumes of the plasma sources 2002. The plasma sources 2002 can be positioned at any location along the pumping line 2004. In some embodiments, at least one plasma source 2002 is positioned upstream from a throttle valve 2010 located within the pumping line 2004. In some embodiments, at least one plasma source 2002 is positioned relatively close to the processing chamber 2006. Even though FIG. 21 shows two plasma sources 2002 coupled to the pumping line 2004, fewer (e.g., one) or more (e.g., three or four) plasma sources can be used.

In a cleaning operation between deposition steps, a cleaning gas, e.g., a fluorinated or chlorinated gas (i.e. $NF_3$, $CF_4$, $NF_3$ combined with $O_2$, $SF_6$, etc.), can be introduced into the processing chamber 2006. The cleaning gas can remove unwanted deposition material that has built up on the chamber walls and other components within the chamber 2006. As the cleaning gas is exhausted from the chamber 2006 via the pumping line 2004, the plasma sources 2002 are turned on to generate a localized plasma in each of the plasma sources 2002. The localized plasma is adapted to ionize and dissociate the cleaning gas as it flows through the pumping line 2004 so as to etch away unwanted deposition material that has built up in the pumping line 2004. In some embodiments, in addition to the main cleaning gas supplied from the processing chamber 2006, a secondary source of cleaning gas is directly introduced to one or more of the plasma sources 2002 via an auxiliary port as described above with respect to FIGS. 17 and 18 to enhance the cleaning efficiency of the plasma sources.

Figure 22:
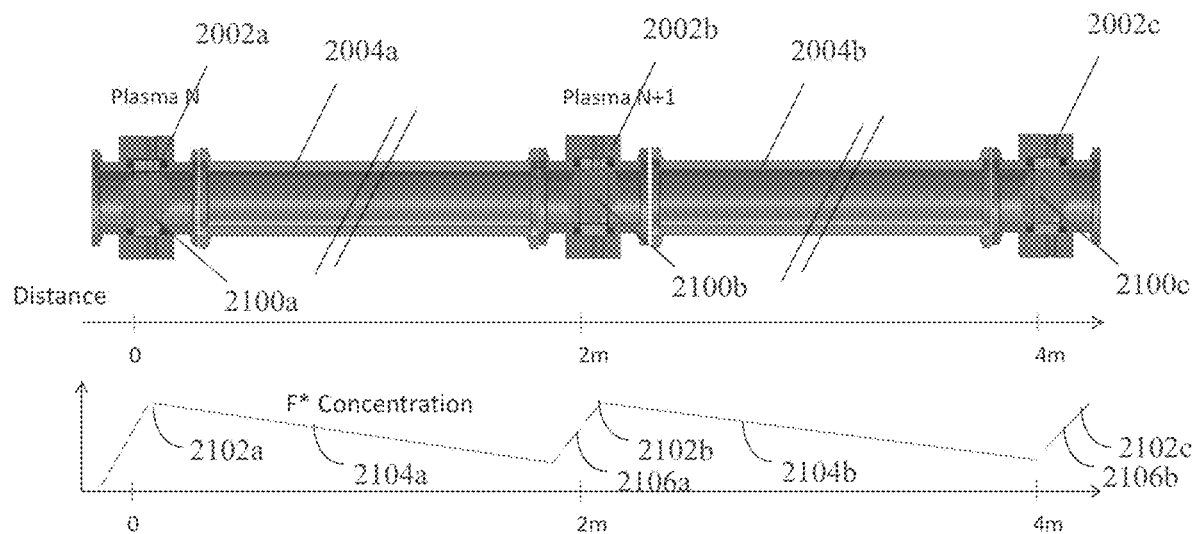
FIG. 22 shows the pumping line of FIG. 21 with multiple plasma sources distributed along its length for cleaning the pumping line.

FIG. 22 shows the pumping line 2004 of FIG. 21 with multiple plasma sources 2002 distributed along its length for cleaning the pumping line 2004. During a cleaning operation, as a cleaning gas travels through the pumping line 2004, a plasma 2100 can be activated at each of the plasma sources 2002, where the plasma 2100 is substantially confined and localized to the interior volume of each plasma source. Therefore, the concentration of dissociated gas molecules is likely to peak 2102 within these interior volumes as the cleaning gas travels through the corresponding plasma sources 2002 and is dissociated by the generated plasmas. However, as the traveling cleaning gas moves away from a plasma source 2002, the concentration of dissociated gas molecules formed tend to decrease 2104 along the flow path due to recombination along the pumping line 2004, until the cleaning gas moves to the next plasma source 2002, which again increases/regenerates 2106 the concentration of dissociated molecules until the peak 2102 is reached again. In some embodiments, the distance between any pair of the plasma sources 2002 along the pumping line 2004 is optimized such that the concentration of dissociated molecules is regenerated with sufficient frequency to maintain effective cleaning capability along the pumping line 2004. In some embodiments, the plasma sources 2002 are spaced about 2 meters to about 3 meters apart from each other along the pumping line 2004 to maintain effective cleaning. For example, as shown in FIG. 22, each plasma source 2002 can be spaced about 2 meters from an adjacent plasma source 2002. In one experiment, when the cleaning gas flow is small (e.g., about 50 to about 100 sccm), a near complete dissociation of the cleaning gas (e.g., more than about 90%) can occur within the pumping line 2004, where each plasma source 2002 can be operated at relative low power (e.g., about 50 to about 100 W). In some embodiment, this type of distributed plasma cleaning along a pumping line can operate for a relative long duration (e.g., about 15 minutes) and/or at infrequent intervals (e.g., weekly).

Figure 23:
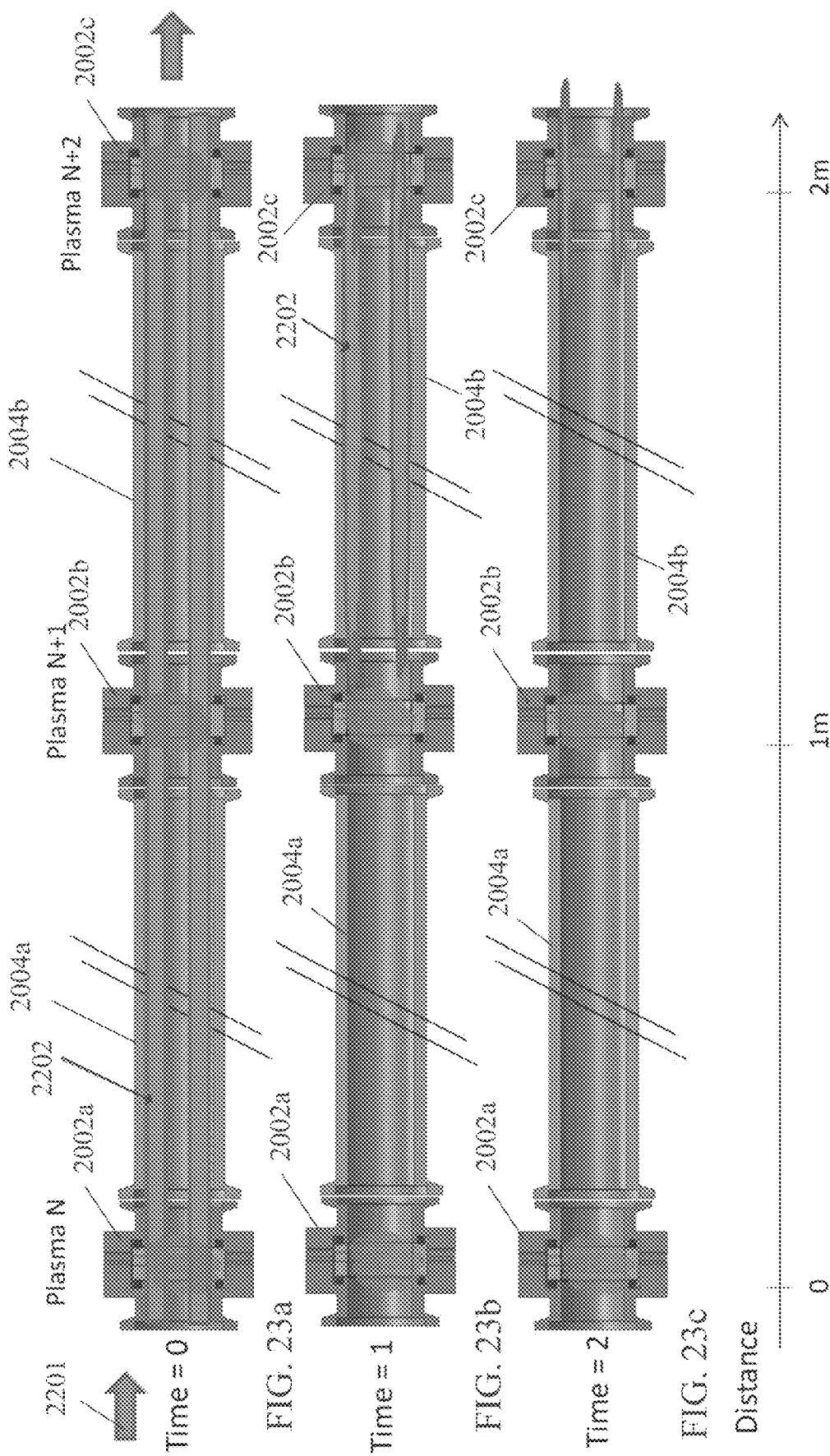
FIGS. 23a-c show an exemplary sequence of steps for cleaning the pumping line of FIG. 22.

FIGS. 23a-c show an exemplary sequence of steps for cleaning the pumping line 2004 of FIG. 22. As shown in FIG. 23a, at the start of the cleaning process (time=0), a cleaning gas (e.g., NF$_3$) 2201 is supplied to the pumping line 2004. At the start of the cleaning process, the interior surface of the pumping line 2004 (including the interior surface of the pumping line segments 2004a, 2004b) has unwanted byproducts 2202 (e.g., Si, SiO$_2$) deposited thereon that are yet to be cleaned. As the cleaning gas enters the first plasma created by the first plasma source 2002a, the cleaning gas is dissociated into individual gas modules (F*) and nitrogen gas (N$_2$). The F* radicals can etch away the unwanted byproducts 2202 over a period of time, e.g., several minutes. Generally, the byproducts closest to the F* at the first plasma source 2002a are the first ones to be etched away or cleaned. As the etching/cleaning process progresses, the F* radicals have the opportunity to flow further downstream, thereby allowing the etching/cleaning process to progress further downstream in a slow moving wave fashion. At time=0, the chemical composition of gases at the second plasma source 2002b and the last plasma source 2002c can comprise mostly of nitrogen (N$_2$) and the byproducts of the etching/cleaning process (i.e. SiF$_4$), which can be a stable gas.

As shown in FIG. 23b, after the etching/cleaning process has reached the second plasma source 2002b (time=1) along the pumping line 2004, the unwanted byproducts 2202 in the pumping line segment 2004b between the second plasma source 2002b and the third plasma source 2002c can be etched/cleaned due to the F* concentration being replenished at the second plasma source 2002b. Thus, the chemical composition of gases around the second plasma source 2002b comprises mostly of nitrogen (N$_2$), fluorine (F$_2$), and dissociated gas modules from the cleaning gas (F*). Because the etching/cleaning process has not reached the last plasma source 2002c at this point in time, the chemical composition of the gases around the last plasma source 2002c remains largely unchanged and still includes the unwanted byproducts 2202. However, the byproducts 2202 in the pumping line segment 2004a between the first plasma source 2002a and the second plasma source 2002b have been reduced/eliminated at time=1.

As shown in FIG. 23c, after the etching/cleaning process has reached the last plasma source 2002c (time=2) along the pumping line 2004, the byproducts 2202 in the pumping line segment 2004 b between the second plasma source 2002b and the third plasma source 2002c have been reduced/eliminated. The chemical composition of gases at the third plasma source 2002c comprises mostly of nitrogen (N$_2$), fluorine (F$_2$) and dissociated gas modules from the cleaning gas (F*). The accumulated byproducts 2202 (e.g., Si, SiO$_2$) around the third plasma source 2002c is substantially consumed. Hence, at this point in time (time=2), the pumping line 2004 is cleaned with unwanted silicon-based byproducts 2202 mostly eliminated. The cleaning/etching reactions described above with respect to FIGS. 23a-c can occur over several minutes. For example, the time segment between time=0 and time=1 may be 5 min and the time segment between time=1 and time=2 may be 10 min.

Table 1 below shows the chemical composition of gases entering each of the plasma sources 2002 at each of the sample points in time (times=0, 1, and 2) for the cleaning process described above with reference to FIGS. 23a-c.

TABLE 1

Chemical composition of gases entering the plasma sources 2002 at various sample points in time for the process of FIGS. 23a-c.

| | Plasma Source 2002a | Plasma Source 2002b | Plasma Source 2002c |
|---|---|---|---|
| Time = 0 | NF$_3$ | N$_2$ + SiF$_4$ | N$_2$ + SiF$_4$ |
| Time = 1 | NF$_3$ | N$_2$ + F$_2$ + F* | N$_2$ + SiF$_4$ |
| Time = 2 | NF$_3$ | N$_2$ + F$_2$ + F* | N$_2$ + F$_2$ + F* |

For this example, the input cleaning gas supplied to the pumping line 2004 is NF$_3$. The radicals generated after dissociating the cleaning gas are represented by F*. The unwanted byproducts accumulated in the pumping line 2004 are Si and SiO$_2$. The byproducts generated by the etching/cleaning process are SiF$_4$, which is a stable gas and can be pumped away from the pumping line 2004. As explained above, due to the traveling nature of the etching/cleaning process, at time=1, areas near the plasma source 2002b and the pumping line segment 2004a are cleaned to substantially eliminate the deposited byproducts. At time=2, areas near both the plasma sources 2002b, 2002c and the pumping line segments 2004a, 2004b are cleaned to substantially eliminate the deposited byproducts.

In some embodiments, systems and methods can be developed to determine the endpoint of a cleaning process where chemical signatures representative of unwanted byproducts (e.g., Si or $SiO_2$) are no longer detectable at the plasma sources. In one exemplary approach, voltage and/or current of the localized plasmas at the in-line plasma sources are monitored and the resulting measurements are used to calculate the impedance at each of the plasma sources. For a fixed hardware configuration, the impedance can be a function of the gas composition in the plasma source at a particular time, the power applied and the pressure of the gas. The impedances of the plasmas can be monitored over time to detect a steady state of impedance associated with at least one of the plasma sources. For example, if the impedance associated with a particular plasma source changes over time, this indicates that byproducts are still being consumed and the cleaning process is yet to be completed. However, if the impedance reaches a steady state with no changes for a period of time, this indicates that most/all of the byproducts are consumed and further changes are unlike to occur, which signals the end of the cleaning process. In some embodiments, after the endpoint of the cleaning process is detected, an operator can stop the supply of the cleaning gas to the pumping line and/or turn off the localized plasmas at the inline plasma sources. In some embodiments, plasma characteristics other than impedance are monitored to determine the endpoint of a cleaning process. For example, optical emission spectroscopy can be used to monitor wavelengths associated with particular chemical species to determine the endpoint of a cleaning process.

Figure 24:
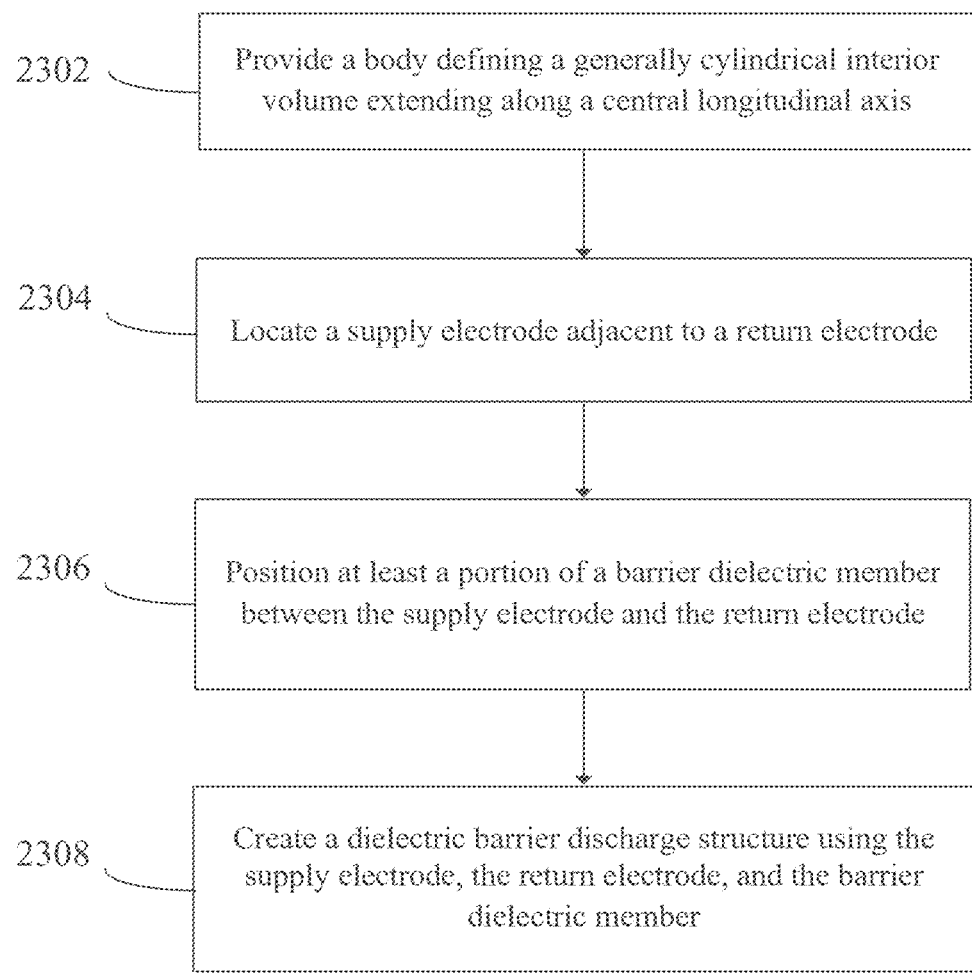
FIG. 24 shows an exemplary process for forming an inline plasma source, such as forming the plasma sources of FIGS. 13-18.

FIG. 24 shows an exemplary process for forming an inline plasma source, such as forming the plasma sources of FIGS. 13-18. The process starts when a body is provided that defines a generally cylindrical interior volume extending along a central longitudinal axis A (step 2302), similar to the bodies 1302, 1402, 1502, 1602 corresponding to the plasma sources 1300, 1400, 1500, 1600, respectively. The body of the inline plasma source can have an input port for coupling to an input pumping line segment and an output port for coupling to an output pumping line segment such that the plasma source forms a segment of the pumping line. Further, the plasma source body defines a generally cylindrical interior volume that can be substantially straight and coaxial with respect to the interior volumes of the input pumping line segment and the output pumping line segment. The resulting interior channel in the pumping line can maintain a generally constant pumping speed and/or conductance regardless of whether the fluid is traveling through the input/output pumping line segments or the plasma source.

To form a dielectric barrier discharge structure of the plasma source, a supply electrode can be located adjacent to a return electrode (step 2304) and at least a portion of a barrier dielectric can be positioned between the supply electrode and the return electrode (step 2306). For example, in the plasma source 1300, the return electrode comprises the grounded plasma source body 1302 that is located adjacent to the buried electrode assembly 1301, which includes the supply electrode 1312 and the barrier dielectric material 1314. In contrast, in each of the plasma sources 1400, 1500, 1600, the return electrode is separated from the plasma source body, and both the return electrode and the supply electrode are both included in the buried electrode assembly. Generally, the return electrode can be electrically grounded, floating (i.e., not connected to a power source), or biased to a negative voltage with respect to the supply electrode. The buried electrode assembly can be arranged such that the supply electrode and/or the return electrode are on an interior surface of the barrier dielectric material exposed to the interior volume of the plasma source. In some embodiments, an isolator dielectric is also included in the buried electrode assembly. A dielectric barrier discharge structure is thereby created incorporating the supply electrode, the return electrode, and the barrier dielectric member (step 2308). The dielectric barrier discharge structure is adapted to generate a localized plasma in the inline plasma source coupled to the pumping line, such as in the interior volume of the plasma source, to clean at least a portion of the pumping line. A high voltage alternative current can be supplied between the supply electrode and the return electrode to activate the dielectric barrier discharge structure to generate the localized plasma.

Figure 25:
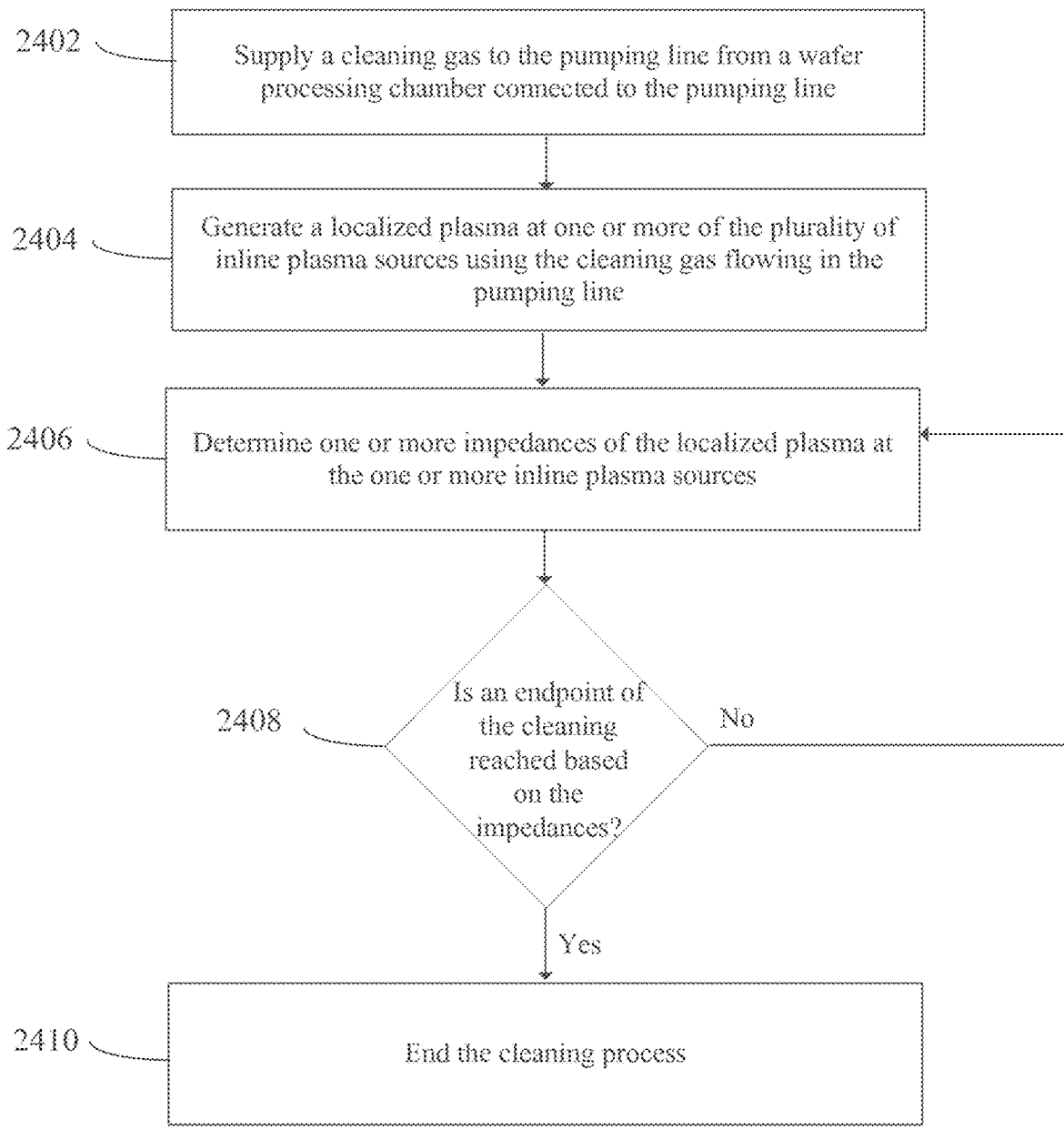
FIG. 25 shows an exemplary process for using a plurality of inline plasma sources of the present invention to clean at least a portion of a pumping line.

In some embodiments, at least one plasma source of the present invention is located in-line with a pumping line and downstream from a wafer processing chamber, similar to the plasma cleaning configuration 2000 illustrated in FIG. 21. As described above, byproducts from a deposition process in the processing chamber can become unwanted material deposition in the interior surface of the pumping line. Therefore, coupling one or more plasma sources to the pumping line enables in-situ cleaning of the pumping line, such as in between deposition operations by the processing chamber. FIG. 25 shows an exemplary process for using a plurality of inline plasma sources of the present invention to clean at least a portion of a pumping line. The plurality of inline plasma sources can be distributed along the length of the pumping line spaced at a regular interval relative to each other (e.g., about 2 to about 3 meters from each other). The process starts with supplying a cleaning gas to the pumping line from a wafer processing chamber connected to the pumping line (step 2402). The cleaning gas can be used to clean both the processing chamber by generating a primary plasma in or upstream of the processing chamber and the pumping line by generating a localized plasma at one or more of the plurality of inline plasma sources (step 2404). In general, the activated primary and localized plasmas are adapted to ionize and dissociate the cleaning gas to etch away the deposits on the walls of the processing chamber and the pumping line, respectively. When cleaning the pumping line, the impedance of the localized plasma at each of the activated in-line plasma sources can be calculated (step 2406). For example, these impedances can be calculated by measuring the current and/or voltage of the corresponding localized plasmas. Based on the impedances, an endpoint of the cleaning process relative to the pumping line can be determined (step 2408). To make this determination, the process can determine whether a steady state of the impedances associated with at least one of the plasma sources has been reached over a predefined period of time. For example, if the impedance at a plasma source at time=1 is substantially the same (e.g., within a threshold difference) as the impedance the the same plasma source at time=2, then a steady state is reached, which indicates that the unwanted byproducts are mostly eliminated/consumed by the cleaning process and no further changes in impedance is likely to occur. If an endpoint of the cleaning process is detected (2410), the localized plasmas can be turned off and/or the supply of the cleaning gas to the pumping line can be stopped. However, if an endpoint is not detected (e.g., the impedance of at least one plasma source continues to change within a predefined time period), the process continues to monitor the impedances of the localized plasmas (step 2406) at regular time intervals to determine whether the endpoint is reached (step 2408). In some embodiments, a secondary supply of a cleaning gas, which can the same as or different from the primary cleaning gas, is directly supplied to one or more of the inline plasma sources to enhance the cleaning efficiency of the corresponding plasma sources.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A plasma source comprising:
   a body defining a generally cylindrical interior volume extending along a central longitudinal axis, the body having an input port, an output port, and an interior surface disposed about the generally cylindrical interior volume;
   a supply electrode disposed adjacent to a return electrode;
   a dielectric member, wherein at least one of the supply electrode or the return electrode is tightly surrounded by the dielectric member; and
   a discharge structure formed from the supply electrode, the return electrode, and the dielectric member, wherein at least a portion of the discharge structure is disposed in the body or on the interior surface of the body, and the discharge structure, which includes the dielectric member tightly surrounding at least one of the supply or return electrode, is adapted to generate a plasma in the generally cylindrical interior volume.

2. The plasma source of claim 1, wherein the return electrode is electrically grounded.

3. The plasma source of claim 1, wherein the return electrode comprises an electrically grounded portion of the body of the plasma source.

4. The plasma source of claim 1, wherein the return electrode and the supply electrode are tightly surrounded by the dielectric member.

5. The plasma source of claim 1, wherein the generally cylindrical interior volume extends substantially straight along the central longitudinal axis.

6. The plasma source of claim 1, wherein the dielectric member defines at least a portion of the generally cylindrical interior volume.

7. The plasma source of claim 1, wherein the supply electrode and the return electrode maintain about the same radial distance to the central longitudinal axis.

8. The plasma source of claim 1, further comprising a cooling channel embedded in the body, the cooling channel configured to conduct a cooling liquid through the body.

9. The plasma source of claim 1, further comprising one or more fins disposed on an exterior surface of the body for cooling the body.

10. The plasma source of claim 1, wherein the interior surface of the body comprises one or more metallic materials.

11. The plasma source of claim 1, further comprising a plurality of supply electrodes and a plurality of return electrodes positioned in an alternating arrangement along the central longitudinal axis.

12. The plasma source of claim 1, further comprising a secondary port disposed in the body and spaced from the input port and the output port, the secondary port configured to conduct a gas flow into the generally cylindrical interior volume of the body.

13. A method of manufacturing a plasma source, the method comprising:
   providing a body defining a generally cylindrical interior volume extending along a central longitudinal axis, the body having an input port, an output port for coupling to an output, and an interior surface disposed about the central longitudinal axis for defining the generally cylindrical interior volume;
   locating a supply electrode adjacent to a return electrode;
   tightly surrounding at least one of the supply electrode or the return electrode by a dielectric member such that at least a portion of the dielectric member is positioned between the supply electrode and the return electrode; and
   creating a discharge structure using the supply electrode, the return electrode, and the dielectric member, wherein at least a portion of the discharge structure is disposed in the body or on the interior surface of the body, and the discharge structure, which includes the dielectric member tightly surrounding at least one of the supply or return electrode, is adapted to generate a localized plasma in the generally cylindrical interior volume.

14. The method of claim 13, further comprising grounding the return electrode.

15. The method of claim 13, further comprising forming the return electrode by electrically grounding at least one portion of the body.

16. The method of claim 13, further comprising tightly surrounding the return electrode and the supply electrode by the dielectric member.

17. The method of claim 13, further comprising defining at least a portion of the generally cylindrical volume by the dielectric member.

18. The method of claim 13, further comprising configuring the discharge structure to generate the localized plasma with a power of about 20 watts to about 1000 watts.

19. The method of claim 13, wherein the generally cylindrical interior volume is coaxial with the pumping line.

20. The method of claim 13, wherein the dielectric member comprises a barrier dielectric member, the method further comprising using a co-fire technique to integrally form at least a portion of the discharge structure including an isolation dielectric member, the barrier dielectric member, and the supply electrode.

21. The method of claim 20, wherein the barrier dielectric member and the isolation dielectric member comprise one or more ceramic materials.

* * * * *